(12) United States Patent
Matsushita et al.

(10) Patent No.: US 9,326,431 B2
(45) Date of Patent: Apr. 26, 2016

(54) SERVER COOLING SYSTEM

(71) Applicant: PANASONIC CORPORATION, Osaka (JP)

(72) Inventors: Takahiro Matsushita, Osaka (JP); Satoshi Uzawa, Osaka (JP); Hiroshi Tsujimura, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 305 days.

(21) Appl. No.: 14/177,478

(22) Filed: Feb. 11, 2014

(65) Prior Publication Data
US 2014/0233173 A1 Aug. 21, 2014

(30) Foreign Application Priority Data

Feb. 15, 2013 (JP) .................................. 2013-028129

(51) Int. Cl.
*F25D 23/12* (2006.01)
*H05K 7/20* (2006.01)

(52) U.S. Cl.
CPC ........ *H05K 7/20836* (2013.01); *H05K 7/20745* (2013.01)

(58) Field of Classification Search
CPC ............... F25B 1/10; F25B 13/00; G06F 1/20
USPC ...................... 62/115, 259.2, 498; 361/679.46
See application file for complete search history.

(56) References Cited

U.S. PATENT DOCUMENTS

| 7,365,973 | B2* | 4/2008 | Rasmussen | .......... H05K 7/2079 361/694 |
| 2010/0305775 | A1* | 12/2010 | Bean, Jr. | ............. H05K 7/20781 700/300 |
| 2011/0128699 | A1* | 6/2011 | Heydari | ............. H05K 7/20745 361/679.48 |
| 2013/0042639 | A1* | 2/2013 | Kobayashi | .............. G06F 1/206 62/186 |

FOREIGN PATENT DOCUMENTS

JP 2012-98799 5/2012

* cited by examiner

*Primary Examiner* — Melvin Jones
(74) *Attorney, Agent, or Firm* — Greenblum & Bernstein, P.L.C.

(57) ABSTRACT

In a server cooling device having a cold zone and a hot zone, a flow of cold air is determined depending on an air conditioner disposed in the hot zone and a size of a casing. A server cooling system is provided in which a chamber is substantially divided into two parts with a cold aisle formed in one part and a hot aisle formed in the other part, and a server rack is disposed on a boundary between the cold aisle and the hot aisle. The server cooling system includes: an air conditioner provided on the hot aisle side; a circulation path disposed so as to extend from the air conditioner to the cold aisle; and a shield provided on the boundary excluding the server rack. The shield is provided with a gallery capable of venting from the cold aisle to the hot aisle.

9 Claims, 27 Drawing Sheets

| MANUFACTURER | MODEL | a2 | a1 | b | c |
|---|---|---|---|---|---|
| 001 | TS-001-01 | -0.000508 | -0.670877 | 0.987 | 35.168722 |
| 001 | TS-001-02 | -0.000512 | -0.671256 | 0.967 | 35.167482 |

FIG. 13A

| MANUFACTURER | MODEL | a2 | a1 | b | c |
|---|---|---|---|---|---|
| 001 | PAC-001-01 | -0.005283 | 0.123316 | 0.072 | 3.957251 |
| 001 | PAC-001-02 | -0.005146 | 0.124831 | 0.069 | 3.942382 |

| REGIONAL CODE | REGIONAL NAME | COUNTRY CODE | COUNTRY NAME | CITY CODE | CITY |
|---|---|---|---|---|---|
| 001 | EUROPE | 021 | ENGLAND | 001 | LONDON |
| 001 | ASIA | 002 | TAIWAN | 001 | TAIPEI |
| 001 | ASIA | 002 | CHINA | 001 | BEIJING |
| 010 | NORTH AMERICA | 011 | U.S.A | 001 | NEW YORK |
| 010 | NORTH AMERICA | 011 | U.S.A | 009 | LOS ANGELES |
| 020 | ASIA | 001 | JAPAN | 001 | TOKYO |

REFERENCE KEY CODE

FIG. 14B

| MONTH | MAXIMUM VALUE | | AVERAGE VALUE | | MINIMUM VALUE | |
|---|---|---|---|---|---|---|
| | TEMPERATURE (°C) | RELATIVE HUMIDITY (%RH) | TEMPERATURE (°C) | RELATIVE HUMIDITY (%RH) | TEMPERATURE (°C) | RELATIVE HUMIDITY (%RH) |
| 1 | 5.6 | 29.8 | 5.6 | 29.8 | 5.6 | 29.8 |
| 2 | 4.1 | 32.6 | 4.1 | 32.6 | 4.1 | 32.6 |
| 3 | 10.6 | 38.1 | 10.6 | 38.1 | 10.6 | 38.1 |
| 4 | 16.2 | 41.8 | 16.2 | 41.8 | 16.2 | 41.8 |
| 5 | 21.6 | 52.3 | 21.6 | 52.3 | 21.6 | 52.3 |
| 6 | 28.4 | 74.8 | 28.4 | 74.8 | 28.4 | 74.8 |
| 7 | 32.1 | 72.1 | 32.1 | 72.1 | 32.1 | 72.1 |
| 8 | 33.8 | 69.4 | 33.8 | 69.4 | 33.8 | 69.4 |
| 9 | 30.8 | 61.7 | 30.8 | 61.7 | 30.8 | 61.7 |
| 10 | 26.4 | 54.3 | 26.4 | 54.3 | 26.4 | 54.3 |
| 11 | 12.1 | 40.6 | 12.1 | 40.6 | 12.1 | 40.6 |
| 12 | 8.9 | 33.1 | 8.9 | 33.1 | 8.9 | 33.1 |

SERVER COOLING SYSTEM

FIELD

The present invention relates to a server cooling system used in a server center where a large number of servers are installed, in which a plurality of servers are stored on a server rack; the server rack is disposed in a cooling chamber; and a hot aisle and a cold aisle are provided in the chamber to cool the servers.

BACKGROUND

Due to proposals such as a cloud system, there is an increasing demand for a datacenter containing a large number of servers. Since a server consumes a large amount of current, it generates heat. Thus, a cooling system for cooling the large number of servers together is needed. As an example of such a cooling system, a system has been proposed in which a hot zone and a cold zone are provided in a casing; and a server rack is disposed on a boundary therebetween so that cold air from the cold zone cools the server rack, warm air generated due to heat exchange is cooled by a cooler in the hot zone, and the cooled air is supplied to the cold zone again (Patent Literature 1).

When such a cooling system is employed, servers are packed in each casing. The system may have various advantages as follows: by employing a container type casing, the shipping thereof can be made easier; since each unit is optimally designed beforehand, its energy conservation ability is excellent; speedy construction of a datacenter and early start of its operation can be realized only by disposing a plurality of casings side by side; and an outdoor type datacenter can be constructed.

CITATION LIST

Patent Literature

Patent Literature 1: Japanese Patent Application Laid-Open No. 2012-98799

SUMMARY

Technical Problem

In the cooling system as in Patent Literature 1, the cooling efficiency thereof is determined by how cold air flows from the cold zone to the hot zone. Such a cold air flow is determined depending on an air conditioner disposed in the hot zone and a size of the casing. However, the capacity of the air conditioner and the size of the casing have some rules to obey and cannot be designed completely freely.

In a case where a casing of a certain size needs to be used, for example, an air conditioner best suited to that size does not always exist. In other words, the efficiency of cooling capacity fails to be optimized unless an appropriate combination of the air conditioner and the casing exists incidentally.

On the other hand, a certain level of energy conservation indicated by an index called PUE, which is a ratio between a power consumed by the servers themselves and a power consumed by the entire system including the cooling system, is required in a data system. While the servers need to be cooled, using a large amount of power for the cooling is undesirable since the cost is increased.

Solution to Problem

The present invention has been conceived in view of the above-described problems. The present invention is a server cooling system in which a hot aisle (hot zone) and a cold aisle (cold zone) are provided in a chamber (casing) and a server rack is disposed on a boundary therebetween. The present invention can increase the cooling efficiency.

More specifically, a server cooling system according to the present invention is a server cooling system in which a chamber is substantially divided into two parts with a cold aisle formed in one of the two parts and a hot aisle formed in the other one of the two parts, and a server rack is disposed on a boundary between the cold aisle and the hot aisle. The server cooling system includes: an air conditioner (packaged air conditioner) provided on the hot aisle side; a circulation path disposed so as to extend from the air conditioner to the cold aisle; and shielding means provided on the boundary excluding the server rack. The shielding means is provided with a gallery capable of venting from the cold aisle to the hot aisle.

Advantageous Effects of Invention

In the server cooling system according to the present invention, the shielding means for preventing cold air from passing through a space between the server rack and an inner wall of the chamber is disposed on the boundary between the cold aisle and the hot aisle. Also, the shielding means is provided with the gallery capable of adjusting a degree of opening thereof. Therefore, the flow of cold air traveling from the cold aisle toward the hot aisle can be adjusted independently of the size of the chamber and the capacity of the air conditioner. Thus, it becomes possible to obtain an advantageous effect such that the server rack can be cooled efficiently.

Moreover, the server cooling system according to the present invention includes three kinds of cooling means, i.e., an air conditioner, a thermosiphon, and outside air cooling means. By determining coolable heat quantities and coefficients of performance (COPs) for those cooling means, the cooling means can be operated while being switched among them. Therefore, it becomes possible to obtain an advantageous effect in which the power consumption can be minimized while maintaining required coolable heat quantities.

BRIEF DESCRIPTION OF DRAWINGS

FIG. 13A is a diagram showing a database of the thermosiphon, and FIG. 13B is a diagram showing a database of the packaged air conditioner.

FIGS. 14A and 14B show a database of outside air temperatures and relative humidities for different cities.

DESCRIPTION OF EMBODIMENTS

A server cooling system according to the present invention will now be described below with reference to the drawings. Note however that the following description presents embodiments of the present invention as examples and the present invention is not limited to the embodiments to be described below. The following embodiments can be modified without departing from the scope of the present invention.

(First Embodiment)
<Description of Configuration>

Figure 1:
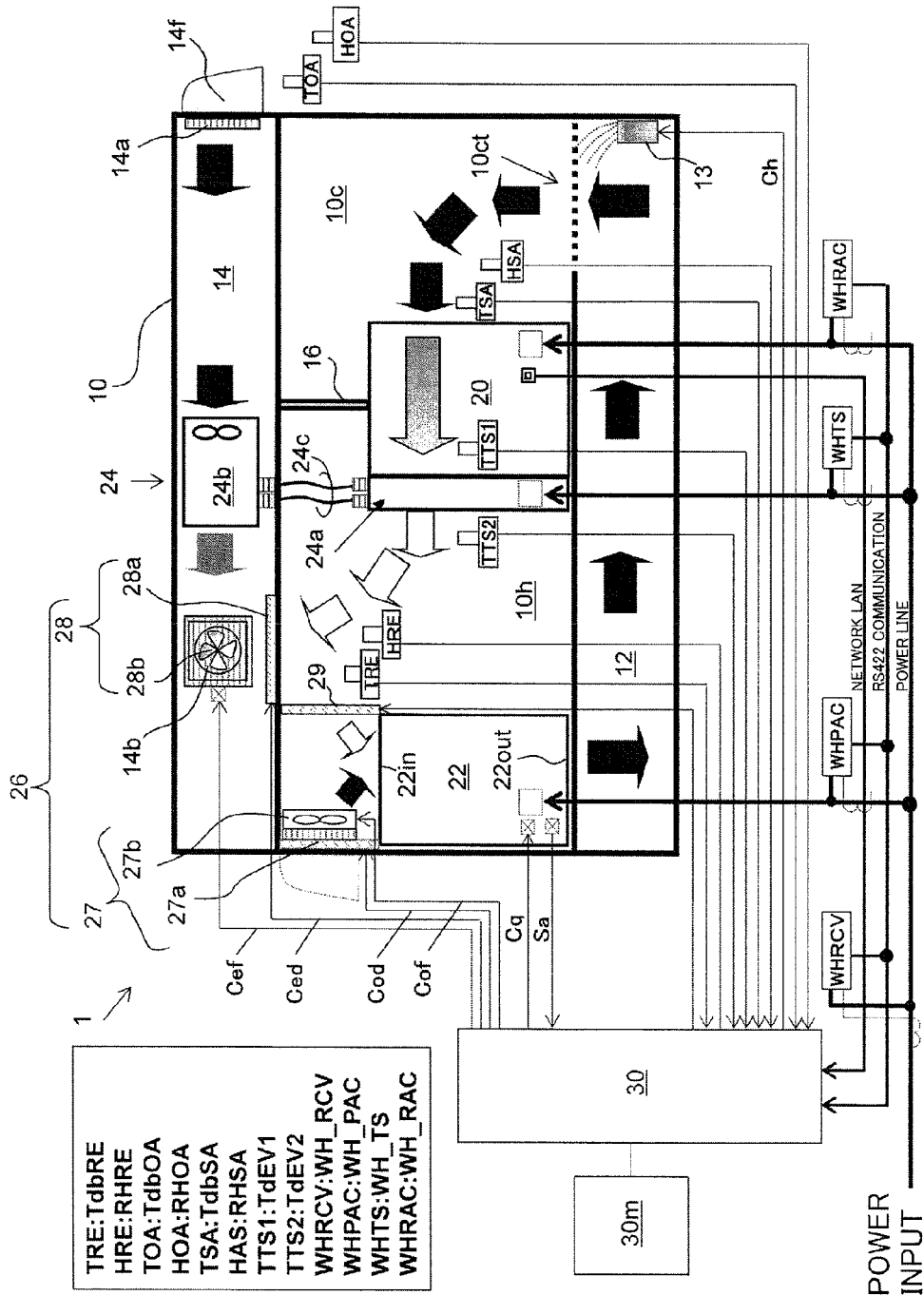
FIG. 1 is a diagram illustrating the configuration of a server cooling system 1.

FIG. 1 is a diagram illustrating the configuration of a server cooling system according to the present invention. A server cooling system 1 of the present invention includes: a chamber 10; a circulation path 12 provided under the floor of the chamber 10; a humidifier 13 disposed in the circulation path 12; an outside air pathway 14 provided in the ceiling of the chamber 10; a server rack 20 disposed approximately in the center of the chamber 10; a thermosiphon 24 disposed at a back side of the server rack 20; and an air conditioner (packaged air conditioner) 22 disposed on a side in the chamber 10 at which the thermosiphon 24 is disposed.

Provided above the air conditioner 22 is outside air cooling means 26. The outside air cooling means 26 includes: outside air introducing means 27 including an outside air damper 27a and an outside air fan 27b; and exhaust means 28 including an exhaust damper 28a for allowing the inside of the chamber 10 to be in communication with the outside air pathway 14 and an exhaust fan 28b provided in the outside air pathway 14.

A control device 30 for controlling the entire system is provided outside the chamber 10. A supply air temperature sensor TSA, a supply air humidity sensor HSA, a return air temperature sensor TRE, a return air humidity sensor HRE, an outside air temperature sensor TOA, an outside air humidity sensor HOA, a thermosiphon evaporator inlet temperature sensor TTS1, a thermosiphon evaporator outlet temperature sensor TTS2, a packaged air conditioner power monitor WHPAC, a thermosiphon power monitor WHTS, a server power monitor WHRAC, and a received power monitor WHRCV are provided at various places of the chamber 10, respectively, and are each connected to the control device 30. The control device 30 is also connected to the air conditioner 22, the outside air damper 27a, the outside air fan 27b, the exhaust damper 28a, and the exhaust fan 28b.

Figure 2:
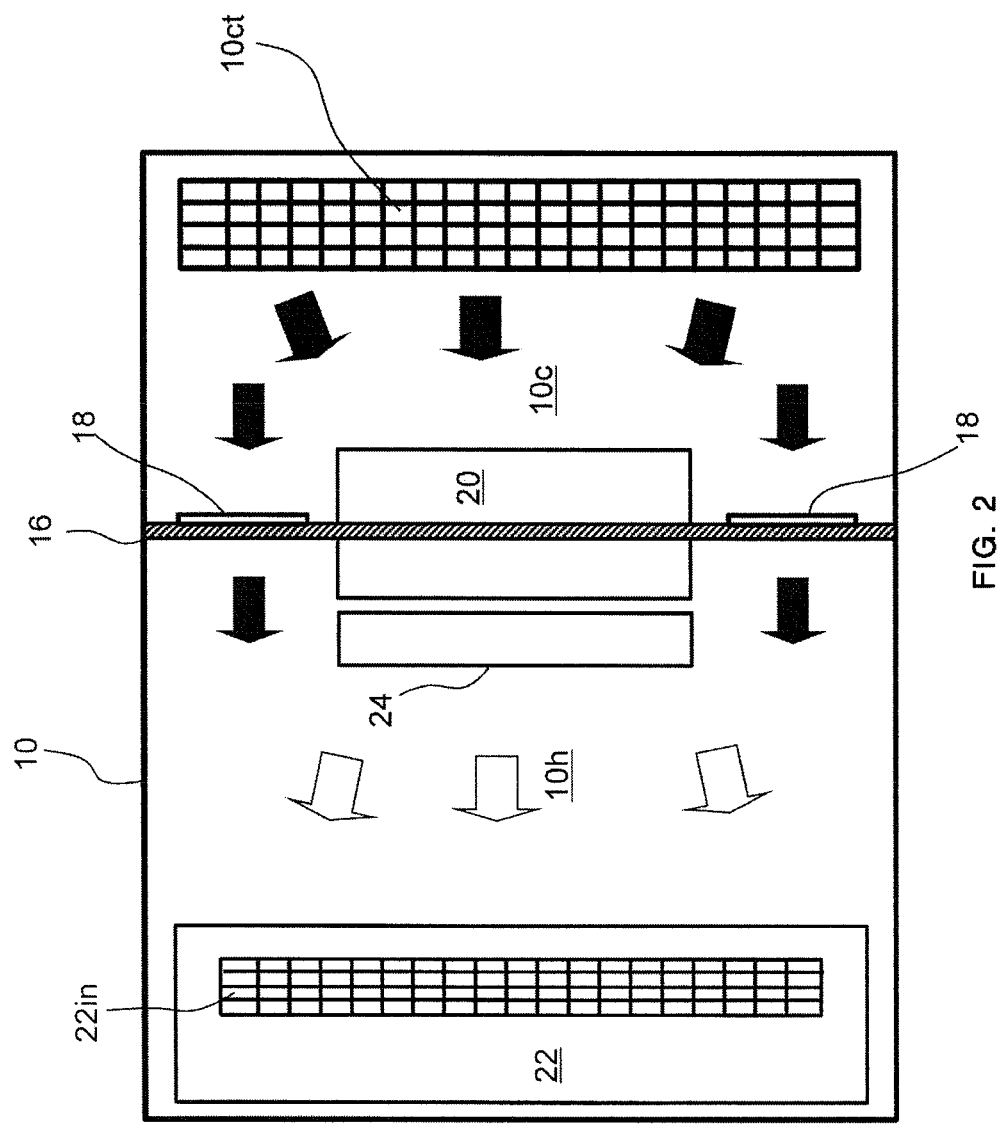
FIG. 2 is a plan view of a chamber in the server cooling system 1.

FIG. 2 shows a plan view of the chamber 10. The server racks 20 are disposed side by side approximately in the center of the chamber 10. A partition wall 16 is provided between the server rack 20 and a side surface of the chamber 10. The partition wall 16 is provided with galleries 18.

Referring back to FIG. 1, the partition wall 16 is also provided to extend between the server rack 20 and the ceiling of the chamber 10. Another gallery 18 (see FIG. 2) may be provided to this area of the partition wall 16.

<Configuration Details and Connection Relationships>

The chamber 10 has a shape of a rectangular parallelepiped and is covered with a heat insulator. However, the shape of the chamber 10 is not limited to the rectangular parallelepiped as long as the inside thereof can be substantially divided into two parts. Substantially dividing into two parts herein refers to dividing the inside of the chamber 10 into two areas, i.e., a cold aisle 10c filled with cold air and a hot aisle 10h filled with warm air generated by being warmed up due to heat exchange with the server. In other words, as long as the cold aisle 10c and the hot aisle 10h can be provided, the chamber 10 may be divided into three or more parts. As a specific example, the chamber 10 may be divided into three parts and the center part may be configured to serve as the cold aisle 10c with the spaces at the both ends thereof configured to serve as the hot aisles 10h.

The server rack 20 is disposed at the boundary between the hot aisle 10h and the cold aisle 10c. The server rack 20 is a shelf provided with shelf plates running through from the front side (the cold aisle 10c side) toward the back side (the hot aisle 10h side) and each having a server unit 20u (see FIG. 3), including an MPU (Micro Processor Unit) and a memory, disposed at each running-through portion. A plurality of server racks 20 may be disposed. All of the server racks 20 are disposed in such a manner that the front sides thereof face the cold aisle 10c and the back sides thereof face the hot aisle 10h. Note that "server rack power consumption" refers to a power consumed by all of the server units 20u.

There are spaces between the server rack 20 and the chamber 10, i.e., spaces between the chamber 10 and the side surfaces of the server rack 20 and a space between the chamber 10 and the upper surface of the server rack 20. Shielding means serves to shield these spaces. Here, the partition wall 16 is configured to serve as the shielding means. The shielding means may be any means other than the partition wall 16 as long as it can prevent cold air from directly traveling from the cold aisle 10c side to the hot aisle 10h side.

The partition wall 16 is provided with the galleries 18 (see FIG. 2). The gallery 18 is a vent in the form of a blind. By changing an angle of a slat with a strip shape, a degree of opening in the vent can be changed. In other words, a flow rate of air passing through the gallery 18 can be regulated. The galleries 18 are provided to allow part of cold air flowing from the cold aisle 10c to the hot aisle 10h to be passed therethrough without changing the temperature thereof. In other words, the galleries 18 are provided in the partition wall 16 so as to be capable of venting from the cold aisle 10c to the hot aisle 10h. This is because the galleries 18 adjust a pressure to thereby adjust a volume of air flowing through the server rack 20.

The air conditioner (packaged air conditioner) 22 is disposed on an inner wall of the chamber 10 on the hot aisle 10h side. A return air inlet 22in is provided on an upper surface of the air conditioner 22 and a cold air outlet 22out is provided on a lower surface thereof. Also, the air conditioner 22 is preferably capable of changing its cooling capacity at multiple levels. This is because an unnecessary power can be saved if the cooling capacity can be changed. When the air conditioner 22 receives a request command (cooling capacity level request command) Cq from the control device 30, the cooling capacity level is changed.

If the air conditioner 22 continues to operate while keeping its cooling capacity at a low level, the delivery of lubricating oil in a compressor (not shown) therein eventually stops. Thus, the air conditioner 22 itself performs oil restoring control at regular time intervals. In the oil restoring control, an operation to maximize its cooling capacity is performed. When the oil restoring control is performed, the air conditioner 22 sends an oil restoring operation notification signal Sa to the control device 30.

The circulation path 12 is provided under the floor of the chamber 10. The circulation path 12 is a transfer path for sending cold air from the cold air outlet 22out of the air conditioner 22 to a cold air supply port 10ct in the cold aisle 10c. Therefore, a floor surface of the chamber 10 is provided with through holes on the hot aisle 10h side and the cold aisle 10c side, respectively. The through hole on the hot aisle 10h side sends out cold air from the air conditioner 22 to the circulation path 12. The through hole on the cold aisle 10c side sends the sent cold air into the chamber 10. The through hole on the cold aisle 10c side is referred to as the cold air supply port 10ct. A grating or the like is preferably provided to the cold air supply port 10ct in order to prevent something from dropping into the circulation path 12.

The humidifier 13 is disposed on the cold aisle 10c side or circulation path 12 side of the cold air supply port 10ct. The humidifier 13 is provided in order to add humidity to the cold air (supply air). If the cold air is overdried, static electricity is generated inside the server rack 20, possibly resulting in a breakdown of an electronic device. The humidifier 13 provided thereto can avoid such a condition. Note that the operation of the humidifier 13 is controlled by a command Ch from the control device 30.

Although the circulation path 12 is disposed under floor in this embodiment, the circulation path 12 may be disposed at a place other than under floor as long as the cold air from the air conditioner 22 disposed in the hot aisle 10h can be transferred to the cold aisle 10c.

The outside air pathway 14 is provided in the ceiling of the chamber 10. The outside air pathway 14 is a pathway for outside air provided with a ventilation fan 14f and is a duct having an inlet 14a and an outlet 14b. FIG. 1 shows an example in which the ventilation fan 14f is provided on the inlet 14a side. The outlet 14b is also opened to outside air. Note that the outlet 14b is provided with the exhaust damper 28a and the exhaust fan 28b in FIG. 1.

The exhaust damper 28a to be opened between the outside air pathway 14 and the chamber 10 and the exhaust fan 28b provided between the outside air pathway 14 and the exterior are provided in the outside air pathway 14. These components make up the exhaust means 28. Moreover, the outside air damper 27a and the outside air fan 27b to be in communication with outside air are provided above the air conditioner 22 disposed on the hot aisle 10h side of the chamber 10. These components make up the outside air introducing means 27. The exhaust means 28 and the outside air introducing means 27 together make up the outside air cooling means 26.

The outside air damper 27a, the outside air fan 27b, the exhaust damper 28a, and the exhaust fan 28b are each connected to the control device 30. They are operated in accordance with commands from the control device 30. The control device 30 can send a command Cod to the outside air damper 27a, a command Cof to the outside air fan 27b, a command Ced to the exhaust damper 28a, and a command Cef to the exhaust fan 28b, respectively, so as to control them.

If the exhaust damper 28a is opened, return air in the hot aisle 10h is not supplied to the return air inlet 22in of the air conditioner 22. Thus, in a case where another damper is separately provided between the hot aisle 10h and the return air inlet 22in as an embodiment for realizing the same function, the damper may be operated in cooperation with the exhaust damper 28a or they may be operated separately. Such a damper can be referred to as a return air damper 29.

The thermosiphon 24 is disposed at the back side (hot aisle 10h side) of the server rack 20. The thermosiphon 24 evaporates a medium with an evaporator 24a. The vaporized medium moves to a condenser 24b through a cooling pipe 24c. The condenser 24b liquefies the medium. When liquefying the medium, a heat corresponding to an amount of latent heat is released. The liquefied medium gravitationally goes through the cooling pipe 24c and returns to the evaporator 24a. The thermosiphon 24 is efficient since no compressor is employed. However, the performance thereof is influenced by the external temperature.

The evaporator 24a of the thermosiphon 24 is provided so as to cover the back side of the server rack 20. This is because the cold air having passed through the server rack 20 has undergone an increase in the temperature thereof due to heat exchange and such a temperature is used to evaporate the medium. In other words, a preferred arrangement is such that the back side of the server rack 20 appears to be covered by the evaporator 24a of the thermosiphon 24 as viewed from the hot aisle 10h side.

The condenser 24b is disposed in the outside air pathway 14. This is because it is preferred to dispose the condenser 24b gravitationally above the evaporator 24a in view of the structure of the thermosiphon 24. The condenser 24b includes a fan and a radiator and cools the vaporized medium for liquefaction.

The control device 30 is a computer configured by an MPU and a memory. Preferably, the control device 30 includes man-machine devices 30m such as a display screen and input means and is capable of easily monitoring the state of the server cooling system 1. Also, the control device 30 is connected to the sensors provided at various places of the server cooling system 1.

At the front side of the server rack 20 (between the cold air supply port 10ct and the server rack 20), the supply air temperature sensor TSA and the supply air humidity sensor HSA are provided. Signals from these sensors are sent to the control device 30 as a supply air dry-bulb temperature TdbSA and a supply air relative humidity RHSA, respectively.

Moreover, the return air temperature sensor TRE and the return air humidity sensor HRE are provided before the return air inlet 22in of the air conditioner 22 (between the return air inlet 22in and the evaporator 24a of the thermosiphon 24). Signals from these sensors are sent to the control device 30 as a return air dry-bulb temperature TdbRE and a return air relative humidity RHRE, respectively.

Moreover, the outside air temperature sensor TOA and the outside air humidity sensor HOA are provided at the inlet 14a of the outside air pathway 14. Signals from these sensors are sent to the control device 30 as an outside air dry-bulb temperature TdbOA and an outside air relative humidity RHOA, respectively.

Moreover, the thermosiphon evaporator inlet temperature sensor TTS1 is disposed at an inlet of the evaporator 24a of the thermosiphon 24 and the thermosiphon evaporator outlet temperature sensor TTS2 is disposed at an outlet of the evaporator 24a of the thermosiphon 24. Signals from these sensors are sent to the control device 30 as an evaporator inlet temperature TdEV1 and an evaporator outlet temperature TdEV2, respectively.

Moreover, the packaged air conditioner power monitor WHPAC is disposed in a power line to the air conditioner 22. The thermosiphon power monitor WHTS is disposed in a power line to the thermosiphon 24. The server power monitor WHRAC is disposed in a power line to the server. The received power monitor WHRCV is provided for monitoring the total received power including those of the server cooling system 1 and the server. Signals from these monitors are sent to the control device 30 as packaged air conditioner power consumption WH_PAC, thermosiphon power consumption WH_TS, server rack power consumption WH_RAC, and a received power WH_RCV, respectively. The control device 30 is also connected to the humidifier 13 and controls the operation of the humidifier 13. These sensors and signals are listed in FIG. 1.

<Determining Degree of Opening in Gallery>

The server cooling system 1 of the present embodiment is configured by the components having the above-described relationships. The server cooling system 1, however, needs to determine the degree of opening in the gallery 18 before the actual operation thereof.

As described above, the server cooling system 1 has the cold aisle 10c and the hot aisle 10h in the chamber 10. The server cooling system 1 cools the server rack 20 disposed on the boundary between the cold aisle 10c and the hot aisle 10h by means of the cold air flowing from the cold aisle 10c toward the hot aisle 10h. Therefore, the flow of the cold air (supply air) moving from the cold aisle 10c toward the hot aisle 10h determines the cooling efficiency of the system.

Figure 3:
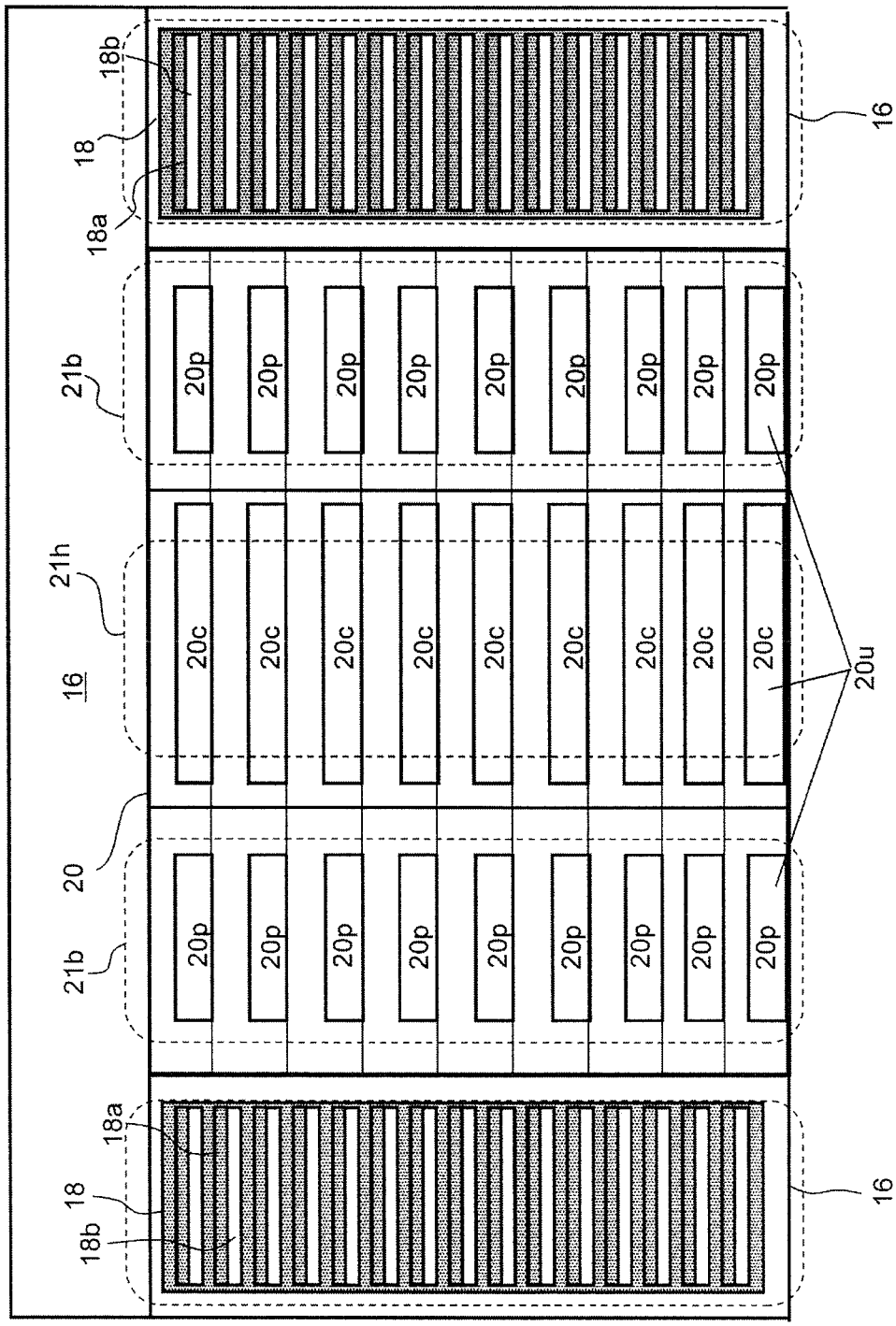
FIG. 3 is a view of a server rack as seen from a back side thereof.

FIG. 3 shows a view of the server rack 20 as seen from the back side thereof (view as seen from the hot aisle 10h side). Although the thermosiphon 24 is disposed at the back side of the server rack 20, it is omitted in this figure. The partition walls 16 are provided so as to be next to the server rack 20. The partition wall 16 is also provided above the server rack 20. The partition wall 16 next to the server rack 20 is provided with the gallery 18. The gallery 18 can change the size of an opening 18b by changing the angle of a slat 18a.

In the server rack 20, a plurality of server units 20u are disposed along a longitudinal direction. A single server unit 20u is configured by a central part 20c at which the MPU is mounted and peripheral parts 20p at which peripheral devices are disposed. In the server unit 20u, the central part 20c and the peripheral parts 20p do not reach a high temperature uniformly. Rather, the central part 20c reaches the highest temperature and the peripheral parts 20p do not produce heat so much.

When return air flows from the cold aisle 10c to the hot aisle 10h with a high wind speed, the temperature of the supply air passing through the central part 20c is raised due to heat exchange. The return air passing through the peripheral parts 20p, however, passes through the server rack 20 without raising its temperature. In other words, the efficiency of heat exchange performed on the supply air is lowered. In FIG. 3, the portion of the supply air having high temperature is denoted by the reference numeral 21h and the portion at which the temperature of the supply air remains the same as that of the cold air is shown by the reference numeral 21b. Note that the cold air flows also from the gallery 18.

Figure 4:
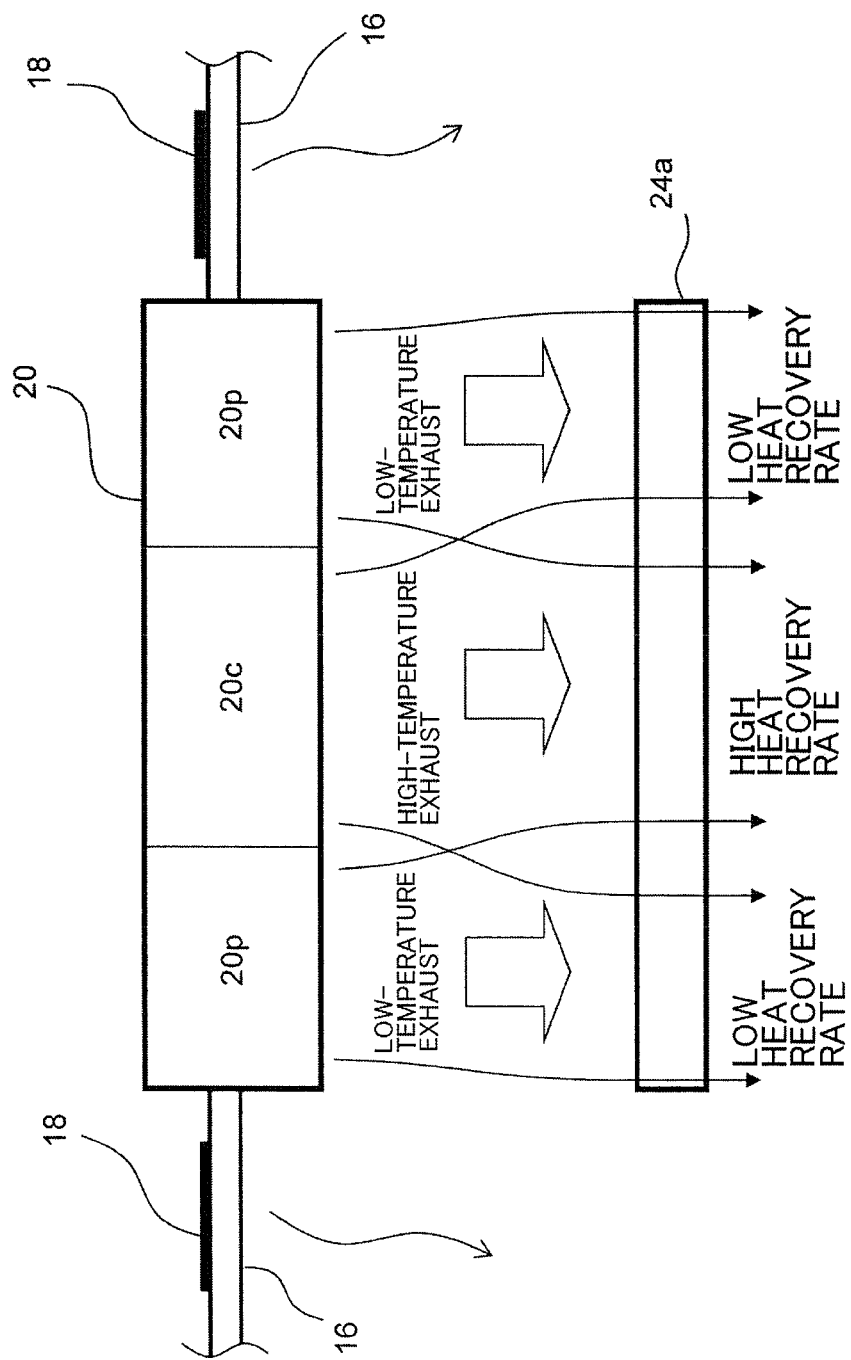
FIG. 4 is a plan view of the server rack illustrating an air flow when the heat efficiency thereof is poor.

FIG. 4 shows a plan view illustrating the server rack 20 and the evaporator 24a of the thermosiphon 24. If the wind speed of the supply air is high, heat exchange is performed only at the central part 20c. As viewed from the perspective of the evaporator 24a of the thermosiphon 24, heat exchange is performed only at a portion of the evaporator 24a, thereby resulting in a reduction in the heat recovery efficiency.

Figure 5:
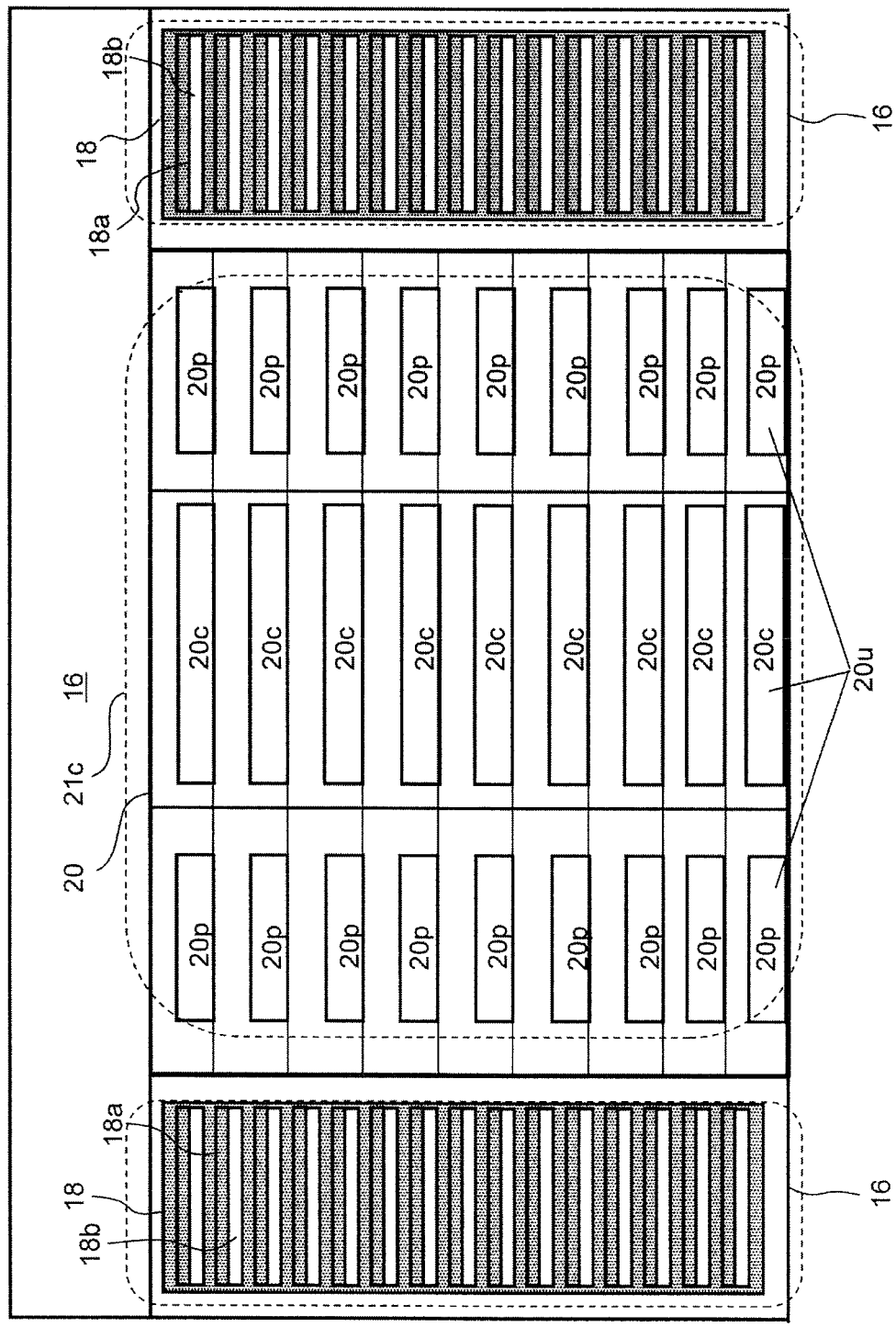
FIG. 5 is a view of the server rack as seen from the back side thereof.

On the other hand, if the wind speed of the return air flowing from the cold aisle 10c to the hot aisle 10h is low, the heat generated by the server units 20u cannot be sufficiently cooled. The highest efficiency can be obtained when the server rack 20 is filled with the heat generated by the MPUs and such heat is replaced with an appropriate amount of the supply air (cold air). In other words, if the heat distribution of the supply air coming out from the back side of the server rack 20 is made approximately uniform, the cooling efficiency can be enhanced. With reference to FIG. 5, a portion shown by the reference numeral 21c represents a portion at which the temperature of the supply air is uniform. Note that being uniform herein means that a difference between the highest temperature and the lowest temperature falls within 10° C. over the entire surface of the server rack 20.

In order to make the heat distribution on the back side of the server rack 20 uniform, the spaces between the server rack 20 and the inner surfaces of the chamber 10 are shielded with the partition walls 16 in the server cooling system 1 according to the present invention. The gallery 18 allowing the supply air to be passed therethrough is provided in the partition wall 16. In other words, the gallery 18 adjusts a differential pressure between the cold aisle 10c and the hot aisle 10h and thereby adjusts the flow of the supply air passing through the server rack 20.

The gallery 18 can change the opening 18b by changing the angle of the slat 18a. Thus, the gallery 18 adjusts the flow of the supply air by changing the opening 18b so as to maximize the cooling efficiency of the server rack 20. Where to provide the gallery 18 in the partition wall 16 and how large the area should be are design matters variable depending on the size of the chamber 10 and the width of the server rack 20.

The degree of opening for the opening 18b of the installed gallery 18 is adjusted by observing the server rack 20 from the hot aisle 10h side with a thermography and changing the angle of the slat 18a in such a manner that the difference between the highest temperature and the lowest temperature at the back side of the server rack 20 falls within 10° C.

Figure 6:
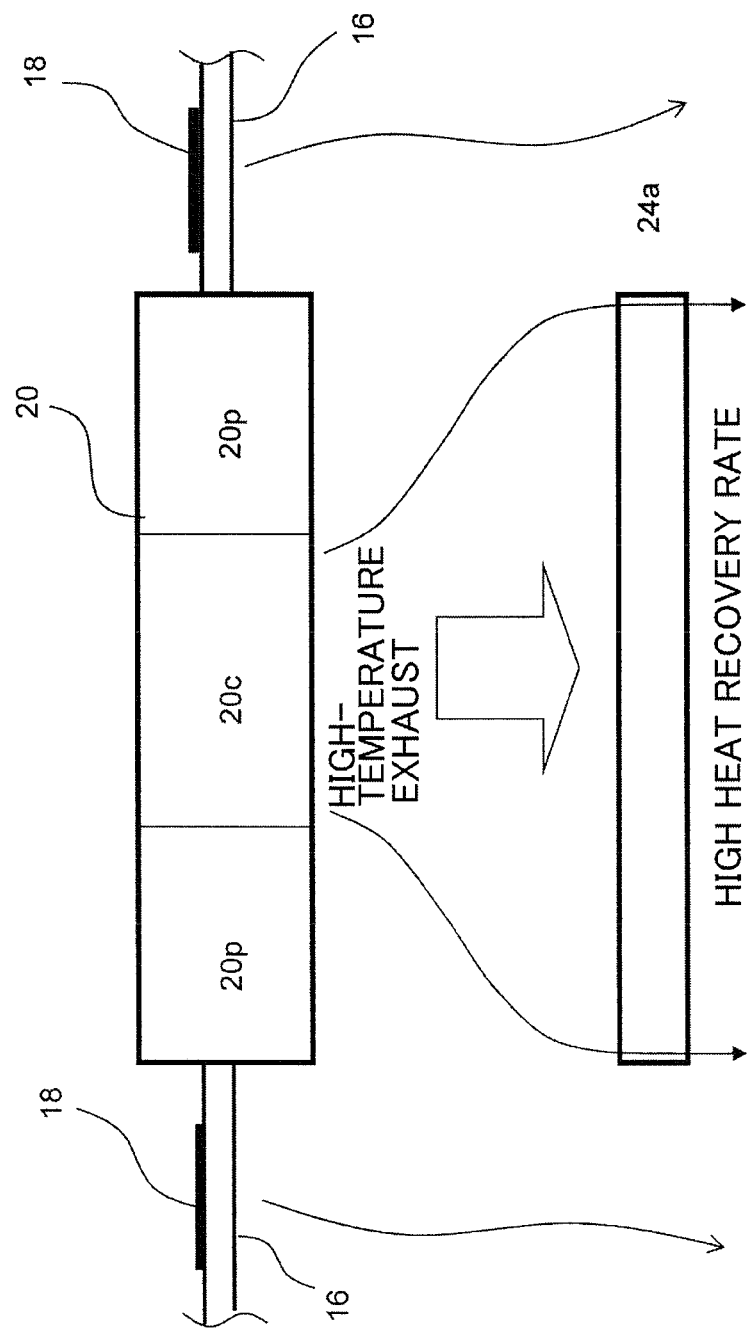
FIG. 6 is a plan view of the server rack illustrating an air flow when the heat efficiency thereof is favorable.

FIG. 6 shows a plan view of the server rack 20 and the evaporator 24a of the thermosiphon 24. By adjusting the wind speed of the cold air with the gallery 18, the supply air coming out from the central part 20c and having the raised temperature spreads all over the evaporator 24a of the thermosiphon 24. In this manner, the heat exchange efficiency at the thermosiphon 24 is improved.

Moreover, in a case where the thermosiphon 24 is disposed on the back side (hot aisle 10h side) of the server rack 20, a coefficient of performance COP_TS of the thermosiphon 24 can be used as an index for determining the degree of opening for the opening 18b of the gallery 18. This is because the cooling can be made more efficient by setting the degree of opening for the opening 18b of the gallery 18 so as to maximize the coefficient of performance COP_TS of the thermosiphon 24. The degree of opening for the opening 18b of the gallery 18 in such a case is determined with the following procedure.

(1) With a door of the evaporator 24a being opened, an exhaust temperature distribution at various places on the back side of the server rack 20 is checked with an image obtained by the thermography and temperatures at the various places are recorded. For example, in the case of the server rack 20 on which 20 server units 20u are arranged, temperatures at 16 points are recorded and an average value thereof is calculated.

(2) With the door of the evaporator 24a being closed, an exhaust temperature distribution at various places on the back side of the server rack 20 is checked with an image obtained by the thermography and temperatures at the various places are recorded. For example, in the case of the server rack 20 on which 20 server units 20u are arranged, temperatures at 16 points are recorded and an average value thereof is calculated.

(3) With the door of the evaporator 24a being closed, wind speeds at the various places on the back side of the server rack 20 are recorded with an anemometer. For example, in the case of the server rack 20 on which 20 server units 20u are arranged, wind speeds at 16 points are recorded and an average value thereof is calculated.

(4) The power consumption by the thermosiphon 24 (WH_TS) is measured with the thermosiphon power monitor WHTS. (5) The coefficient of performance of the thermosiphon 24 (COP_TS) is obtained as follows, where S represents an area of a heat exchanger in the evaporator 24a, v represents the average value of the wind speeds calculated in (3), and qts represents a volume of air passing therethrough.

The volume qts of air passing therethrough is obtained with an expression: $qts=v \times S$ [m/s]. A coolable heat quantity of the evaporator 24a (Q) is expressed as $Q=1.293 \times qts \times (T1-T2)$ [KJ] where: T1 represents the average value of the temperatures at the back side of the server rack calculated in (1); T2 represents the average value of the outlet temperatures of the evaporator 24a calculated in (2); WH_TS represents the power consumed by the thermosiphon 24 measured in (4); and the air density is 1.293 [kg/m$^3$]. Thus, the COP of the thermosiphon 24 can be calculated as $COP\_TS=Q/WH\_TS$.

While changing the degree of opening for the opening 18b of the gallery 18 provided for adjusting a differential pressure, the processes (1) to (4) are repeated in order to determine the condition of the slat 18a capable of achieving the highest coefficient of performance COP_TS. Basically, when the image checked by the thermography shows that the exhaust region from the high temperature part is wide and uniform, the coefficient of performance COP_TS reaches its highest value. The thus obtained coefficient of performance is referred to as an "installed COP_TS."

Determining the degree of opening for the gallery 18 provided in the partition wall 16 as described above completes the configuration of the server cooling system 1.

<Overall Operation>

An operation of the server cooling system 1 will now be described. More specifically, it will be described in the <First process flow> section to be described later. Specific methods or expressions for calculating enthalpies or coefficients of performance COPs in the following description will be described in detail in the latter part of this <Overall operation> section or the <Methods for obtaining calculated values> section to be described later.

A power is supplied to the servers disposed on the server rack 20 through the power line. In the server, a large amount of power is consumed mainly at the MPU. Thus, an MPU chip portion mainly serves as a source of heat generation.

With reference to FIG. 1 again, the cold aisle 10c is provided at the front side of the server rack 20 and cold air is blown out from the cold air supply port 10ct. The cold air (supply air) is indicated by black arrows. The cold air performs heat exchange at the heat-generating part such as the MPU when passing through the server rack 20 from the front side to the back side thereof and thereby cools the inside of the server rack 20. Thus, the air from the back side of the server rack 20 flows out as warm air (supply air) having a temperature higher than that of the cold air due to the heat exchange.

The warm air then performs heat exchange when passing through the evaporator 24a of the thermosiphon 24. The heat of the warm air evaporates the medium in the evaporator 24a. The vaporized medium goes up to the condenser 24b and releases the heat, thereby being turned into the liquid state again. The warm air having passed through the thermosiphon 24 is referred to as return air. The return air is indicated by white arrows.

The return air whose heat has been drawn by the thermosiphon 24 flows into the hot aisle 10h. The air conditioner 22 is provided in the hot aisle 10h. The return air is drawn into the air conditioner 22 from the return air inlet 22in of the air conditioner 22 and is further subjected to heat exchange to be turned into cold air again. The cold air is blown into the circulation path 12 from the cold air outlet 22out of the air conditioner 22. The cold air blown into the circulation path 12 from the cold air outlet 22out is referred to also as supply air. The supply air passes through the circulation path 12 and again blows into the cold aisle 10c from the cold air supply port 10ct.

Under conditions such that the outside air temperature is sufficiently low, cooling is performed by means of the outside air. According to the server cooling system 1, a plurality of conditions presented in the <First process flow> section to be described later are used when the outside air is employed. In a case where the outside air cooling means 26 is employed, the cooling capacity of the air conditioner 22 is set to zero and only a blower fan (not shown) is operated. Consequently, the outside air drawn in from the return air inlet 22in of the air conditioner 22 is blown out as it is from the cold air outlet 22out. In this case, the outside air passing through the air conditioner 22 undergoes no heat exchange.

Simultaneously with the opening of the exhaust damper 28a, a pathway from the hot aisle 10h to the return air inlet 22in of the air conditioner 22 is blocked. The exhaust fan 28b is also activated. Furthermore, the outside air damper 27a is opened and the outside air fan 27b is activated. Firstly, these operations cause the return air having passed through the thermosiphon 24 to be passed through the exhaust damper 28a and discharged into the outside by the exhaust fan 28b. Next, the outside air is passed through the outside air damper 27a by the outside air fan 27b and supplied into the return air inlet 22in of the air conditioner 22. The outside air is passed through the air conditioner 22, entered into the circulation path 12, and supplied to the cold aisle 10c. By utilizing the outside air cooling means 26 as described above, the power usage in the air conditioner 22 only comes from the blower fan, thereby being able to save the power consumption thereof.

The control device 30 measures the outside air dry-bulb temperature TdbOA, the outside air relative humidity RHOA, the return air dry-bulb temperature TdbRE, the return air relative humidity RHRE, and an outside air introduced amount q by means of the outside air temperature sensor TOA, the outside air humidity sensor HOA, the return air temperature sensor TRE, the return air humidity sensor HRE, and the outside air fan 27b, respectively. An outside air enthalpy EOA and a return air enthalpy ERE are obtained from these values (see Expressions (26) and (27)) and whether to employ the outside air cooling means 26 is determined in consideration of other conditions. It is also possible to obtain an outside air coolable heat quantity Q_OA, i.e., a heat quantity which can be cooled by the outside air, from the outside air enthalpy EOA and the return air enthalpy ERE (see Expression (28)).

The control device 30 also measures the return air dry-bulb temperature TdbRE, the return air relative humidity RHRE, and the outside air dry-bulb temperature TdbOA by means of the return air temperature sensor TRE, the return air humidity sensor HRE, and the outside air temperature sensor TOA and obtains a coefficient of performance of the air conditioner 22 (real COP_PAC) (see Expression (7)).

The control device 30 also obtains a coefficient of performance of the thermosiphon 24 (corrected COP_TS) being operated under an actually-installed condition from the outside air temperature sensor TOA, the thermosiphon evaporator inlet temperature sensor TTS1, and a correction coefficient α (see Expression (16)). By comparing the magnitudes of the real COP_PAC and the corrected COP_TS, whether to use the thermosiphon 24 is determined.

Figure 7:
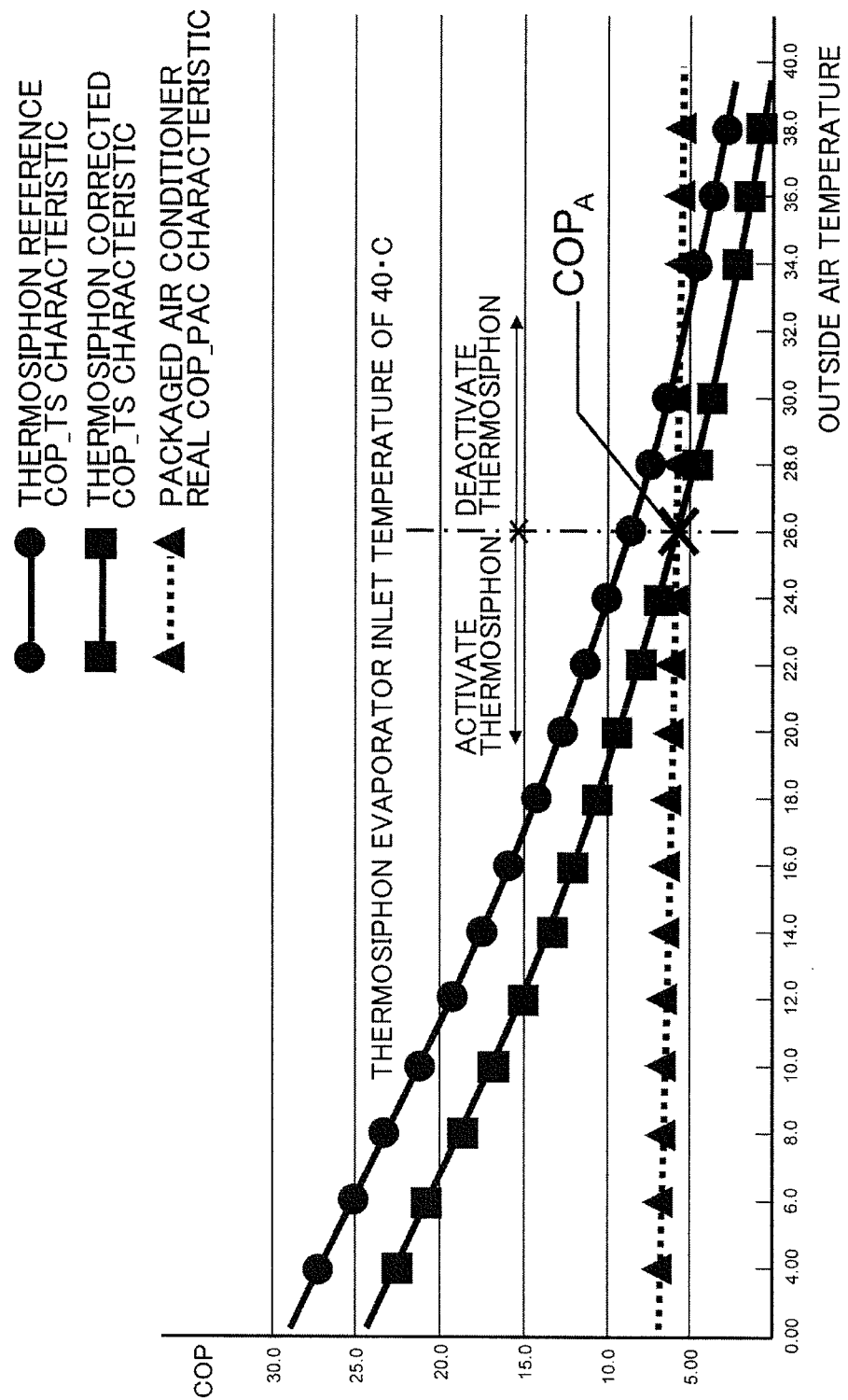
FIG. 7 is a graph showing how a boundary point used for determining whether to use a thermosiphon is obtained from a relationship between outside air temperatures and COPs.

Whether to use the thermosiphon 24 will be described below with reference to FIG. 7. The vertical axis thereof shows a coefficient of performance COP and the horizontal axis thereof shows an outside air temperature (° C.). A black circle line represents reference COP_TS when the thermosiphon evaporator inlet temperature is 40° C. (see Expression (14)). A black square line represents corrected COP_TS after being corrected (see Expression (16)). A black triangle line represents real COP_PAC, i.e., a coefficient of performance of the packaged air conditioner 22 (see Expression (7)).

A coefficient of performance $COP_A$ at a point where the corrected COP_TS line and the real COP_PAC line intersect with each other serves as a boundary whether the thermosiphon 24 is used or deactivated. If the corrected COP_TS is greater than the $COP_A$, the control device 30 activates the thermosiphon 24. If the corrected COP_TS is smaller than the $COP_A$, the control device 30 deactivates the thermosiphon 24.

Note that the coolable heat quantity of the air conditioner 22 (Q_PAC) can be obtained from the real COP_PAC and the power consumption by the packaged air conditioner (WH_PAC) detected by the packaged air conditioner power monitor WHPAC (see Expression (13)), and the coolable heat quantity of the thermosiphon 24 (Q_TS) can be obtained from the corrected COP_TS and the power consumption by the thermosiphon (WH_TS) detected by the thermosiphon power monitor WHTS (see Expression (20)).

Moreover, the control device 30 can detect the server rack power consumption WH_RAC from the server power monitor WHRAC and request a cooling level in accordance with the server rack power consumption WH_RAC to the air conditioner 22. This is to change the cooling capacity of the packaged air conditioner 22 in accordance with the power consumption in the server rack 20.

Figure 8:
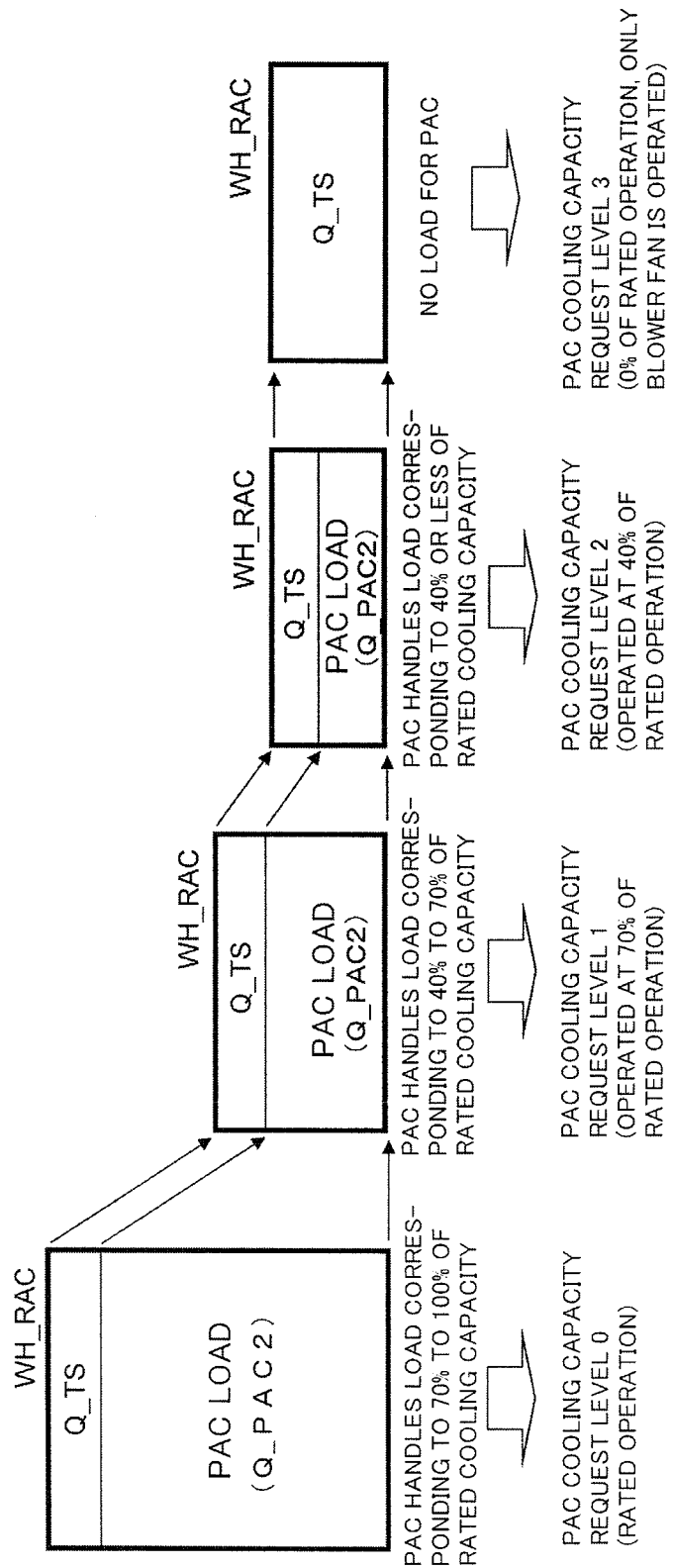
FIG. 8 is a diagram showing a ratio between operational loads for a packaged air conditioner and a thermosiphon.

With reference to FIG. 8, assume that the cooling capacity of the packaged air conditioner 22 can be varied among four levels, i.e., 100%, 70%, 40%, and zero. Needless to say, as long as the cooling capacity can be varied among a plurality of levels, the number of levels is not limited to four. The control device 30 obtains a coolable heat quantity of the air conditioner 22 (Q_PAC) and a coolable heat quantity of the thermosiphon 24 (Q_TS).

Moreover, since the control device 30 detects the power consumption in the server rack 20 (WH_RAC), a heat quantity to be cooled by the packaged air conditioner 22 (Q_PAC2) is obtained by subtracting the coolable heat quantity of the thermosiphon 24 (Q_TS) from the power consumption WH_RAC. If such a load falls within 100% to 70% of the cooling capacity of the packaged air conditioner 22, the control device 30 sets a cooling capacity request level for the packaged air conditioner 22 (the command Cq in FIG. 1) to "zero." This requests that the packaged air conditioner 22 is operated with its cooling capacity kept at 100% (rated operation).

If the heat quantity to be cooled by the packaged air conditioner 22 (Q_PAC2) falls within 70% to 40% of the cooling capacity, the control device 30 sets the cooling capacity request level for the packaged air conditioner 22 (the command Cq in FIG. 1) to "1." This requests that the packaged air conditioner 22 is operated with its cooling capacity kept at 70%.

If the heat quantity to be cooled by the packaged air conditioner 22 (Q_PAC2) is smaller than or equal to 40% of the cooling capacity, the control device 30 sets the cooling capacity request level for the packaged air conditioner 22 (the command Cq in FIG. 1) to "2." This requests that the packaged air conditioner 22 is operated with its cooling capacity kept at 40%.

If no load (Q_PAC2) exists for the packaged air conditioner 22, the control device 30 sets the cooling capacity request level for the packaged air conditioner 22 (the command Cq in FIG. 1) to "3." This requests that the packaged air conditioner 22 is operated with its cooling capacity kept at 0% (only the blower fan is operated). The control device 30 controls the operations of the thermosiphon 24 and the packaged air conditioner 22 in this manner.

The control device 30 also obtains PUE (Power Usage Effectiveness) by dividing the received power (total power consumption) WH_RCV from the received power monitor WHRCV by the power consumption in the server rack 20 (WH_RAC) (see Expression (1)). As the PUE approaches 1.0, power consumption is concentrated more on the server.

Also, the total COP is obtained by dividing the power consumption in the server rack 20 (WH_RAC) by the total power associated with cooling (see Expression (2)). The value of the total COP increases as the power used for cooling decreases. Therefore, this is the value serving as an index for operating the server cooling system 1 while saving the power consumption as much as possible.

As described above, the control device 30 obtains the coolable heat quantities and coefficients of performance about the air conditioner 22, the thermosiphon 24, and the outside air cooling means 26 from the temperature and humidity values at the various components and operates the server cooling system 1 so as to minimize the power consumption associated with cooling. By doing so, the PUE approaches 1.0.

<First Process Flow>

The control flow performed by the control device 30 in the server cooling system 1 described above will now be described in detail on the basis of the flow diagrams of FIGS. 9 to 12. It is assumed that the server is already in operation and the air conditioner 22 and the thermosiphon 24 are also started up already.

Figure 9:
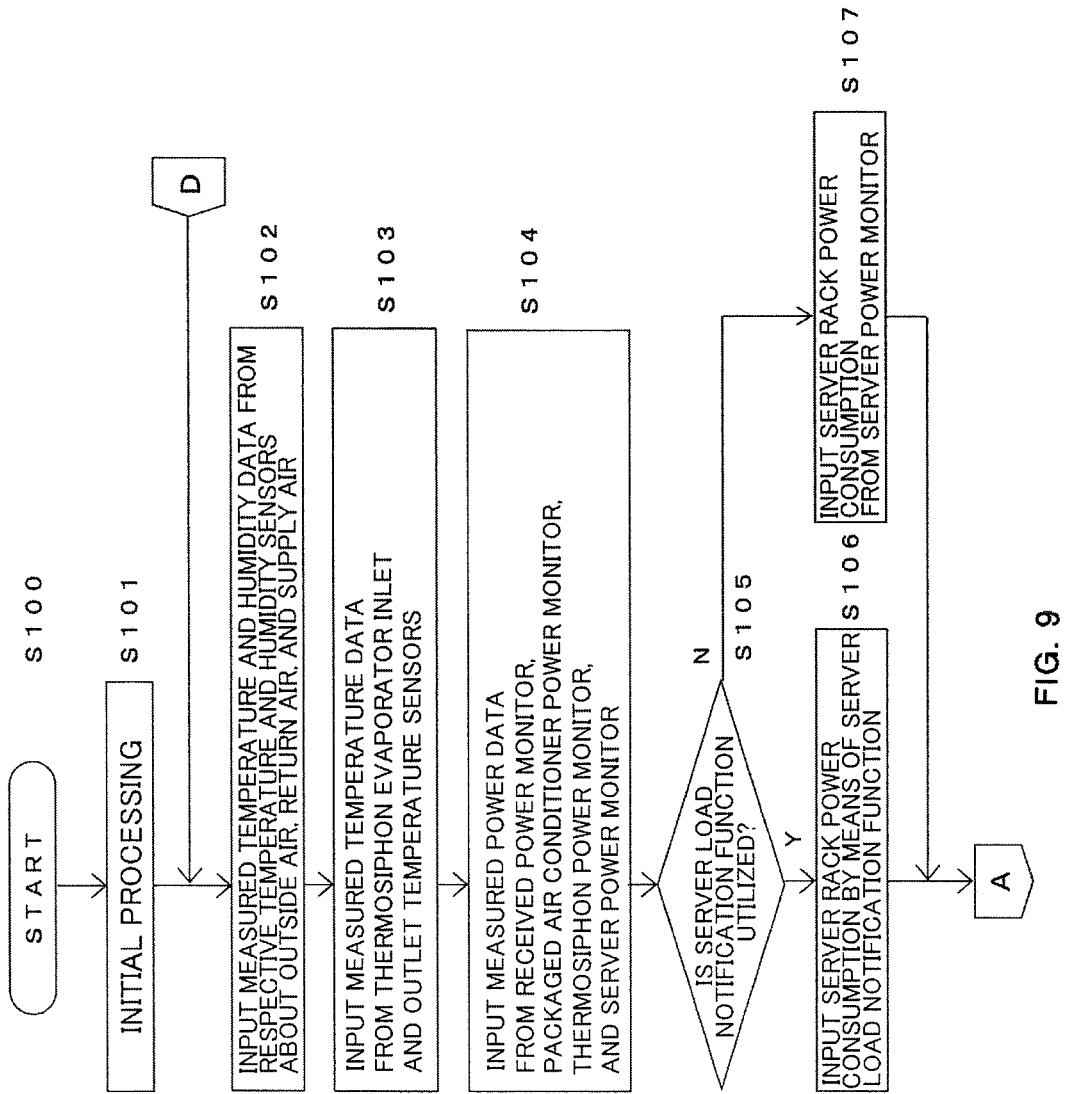
FIG. 9 is a chart showing a process flow of the server cooling system 1.

With reference to FIG. 9, when the control device 30 is powered on, an execution program is started (S100). Next, initial processing is performed (S101). In the initial processing, various initial settings for operating the server cooling system 1 are performed. Among others, predetermined constants (described in FIGS. 13A and 13B) and correction coefficients (see Expressions (17), (18), (19), etc.) in coefficient of performance COP characteristic formulas of the packaged air conditioner 22 and the thermosiphon 24, etc., are loaded into a memory.

After the initial processing is completed, measured data is obtained from the outside air temperature sensor TOA, the outside air humidity sensor HOA, the return air temperature sensor TRE, the return air humidity sensor HRE, the supply air temperature sensor TSA, and the supply air humidity sensor HSA (S102). Also, measured data is obtained from the thermosiphon evaporator inlet temperature sensor TTS1 and the thermosiphon evaporator outlet temperature sensor TTS2 (S103). Also, measured data is obtained from the received power monitor WHRCV, the packaged air conditioner power monitor WHPAC, the thermosiphon power monitor WHTS, and the server power monitor WHRAC (S104).

Next, whether a server load notification function can be utilized or not is determined (S105). This function can be utilized when the server rack 20 itself issues a notification about the current power consumption in response to a request from the control device 30 to the server rack 20. In a case where this function can be utilized (Y-branch in S105), a load factor obtained by means of the server load notification function via a network is converted to obtain the power consumption in the server rack 20 (WH_RAC) (S106). In a case where the server load notification function cannot be utilized (N-branch in S105), the power consumption data from the server power monitor WHRAC is used as the power consumption in the server rack 20 (WH_RAC) (S107).

Figure 10:
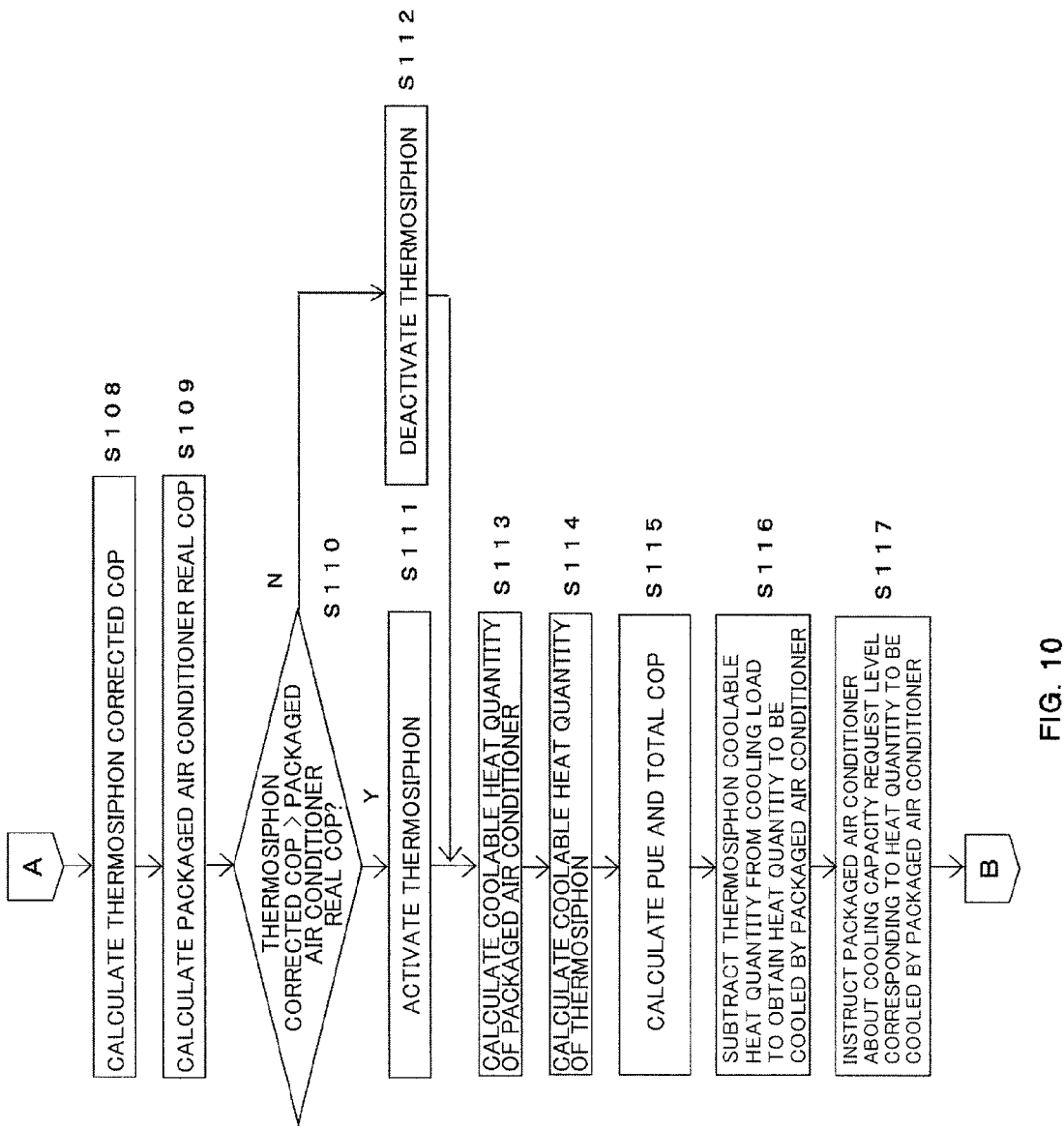
FIG. 10 is a chart showing the process flow of the server cooling system 1.

Referring now to FIG. 10, the coefficient of performance of the thermosiphon 24 (corrected COP_TS) is calculated with an approximate characteristic formula having two variables, i.e., an outside air temperature and an evaporator inlet temperature (S108). Note that this calculation will be described later in detail (see Expression (16)). Also, the return air dry-bulb temperature TdbRE and the return air relative humidity RHRE are converted into a return air wet-bulb temperature TwbRE. Then, the coefficient of performance of the packaged air conditioner 22 (real COP_PAC) (see Expression (7)) is calculated with an approximate characteristic formula having two variables, i.e., an outside air temperature and a return air wet-bulb temperature (S109).

If the coefficient of performance of the thermosiphon 24 (corrected COP_TS) is greater than or equal to the coefficient of performance of the packaged air conditioner 22 (real COP_PAC) (Y-branch in S110), the thermosiphon 24 is activated (S111). If the coefficient of performance of the thermosiphon 24 (corrected COP_TS) is smaller than the coefficient of performance of the packaged air conditioner 22 (real COP_PAC) (N-branch in S110), the thermosiphon 24 is deactivated (S112).

In other words, whether to utilize the thermosiphon 24 is determined on the basis of the magnitude of the coefficient of performance of the thermosiphon 24 relative to the coefficient of performance of the air conditioner 22. This is because it can be concluded that the thermosiphon 24 makes no contribution to cooling and therefore the only thing performed by the thermosiphon 24 is power consumption in a case where the coefficient of performance of the thermosiphon 24 (corrected COP_TS) is smaller than the coefficient of performance of the air conditioner 22 (real COP_PAC).

Next, the coolable heat quantity of the packaged air conditioner 22 (Q_PAC) (see Expression (13)) is calculated by multiplying the power consumption by the air conditioner 22 (WH_PAC) by the coefficient of performance of the air conditioner 22 (real COP_PAC) (S113). Also, the coolable heat quantity of the thermosiphon 24 (Q_TS) (see Expression (20)) is calculated by multiplying the power consumption by the thermosiphon 24 (WH_TS) by the coefficient of performance of the thermosiphon 24 (corrected COP_TS) (S114).

Next, a value obtained by dividing the received power WH_RCV by the server rack power consumption WH_RAC is set as the PUE (see Expression (1)). Condition setting is performed about rated powers of the outside air fan 27b and the exhaust fan 28b used when the outside air cooling is conducted. The total COP (see Expression (3)) is calculated by dividing the server rack power consumption WH_RAC by a value obtained by adding the thermosiphon power consumption WH_TS to the packaged air conditioner power consumption WH_PAC or by a value obtained by further adding thereto the powers for the outside air fan 27b and the exhaust fan 28b in a case where it is determined that the outside air cooling can be utilized (S115).

A heat quantity obtained by subtracting the thermosiphon coolable heat quantity Q_TS from a cooling load Q_L, i.e., the power consumption in the server rack 20 (WH_RAC) is set as the heat quantity to be cooled by the packaged air conditioner 22 (Q_PAC2) (S116). Then, an instruction about the cooling capacity request level corresponding to the heat quantity to be cooled by the packaged air conditioner 22 (Q_PAC2) is issued to the packaged air conditioner 22 (S117).

Figure 11:
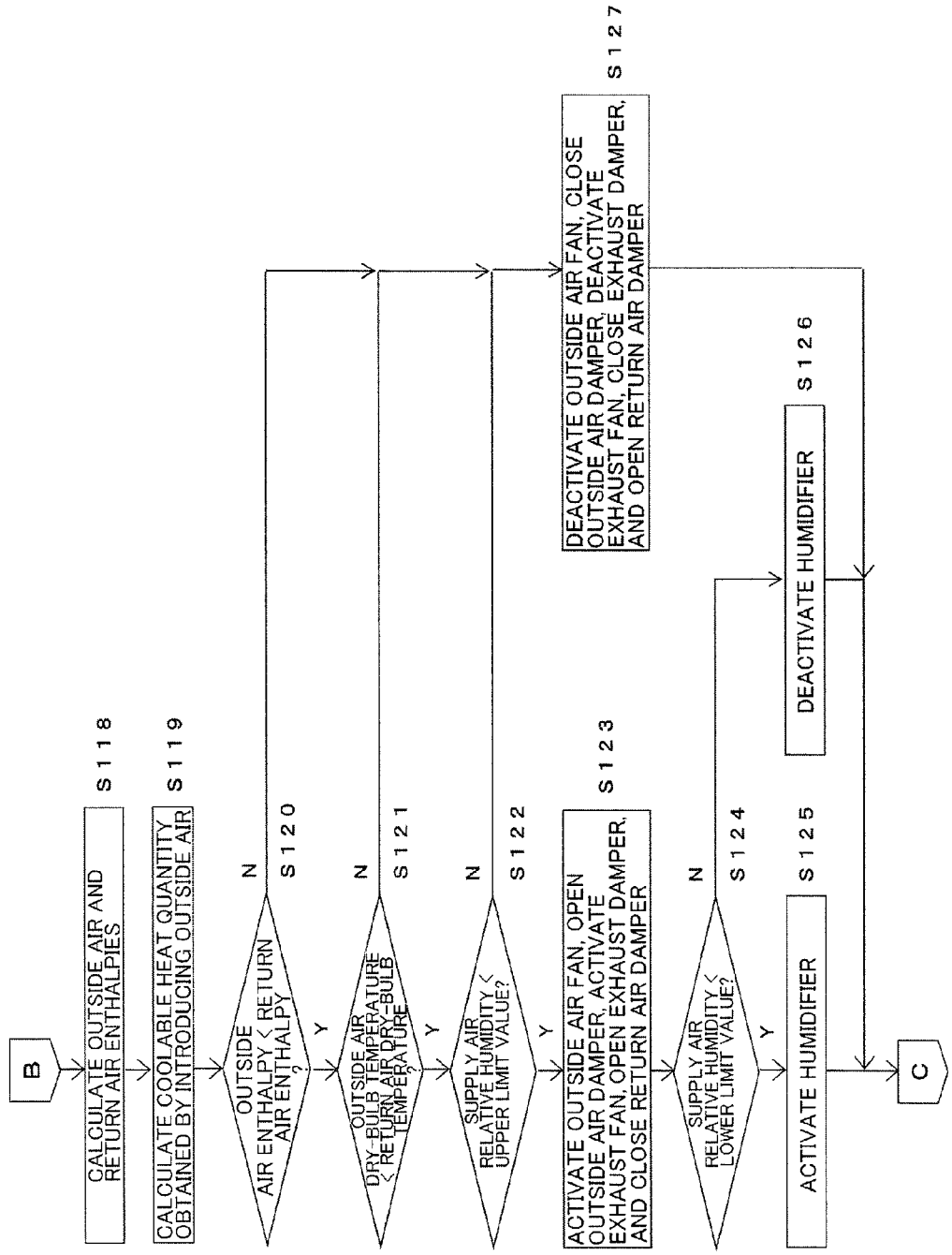
FIG. 11 is a chart showing the process flow of the server cooling system 1.

Referring now to FIG. 11, the outside air and return air enthalpies (see Expressions (26) and (27)) are calculated from dry-bulb temperatures and relative humidities (S118). These calculations will also be described later in detail. Also, the outside air coolable heat quantity (LOA (see Expression (28)) is calculated from a difference value between the outside air enthalpy EOA and the return air enthalpy ERE, the outside air introduced amount q, and an air density ρ (S119). Then, whether to utilize the outside air cooling means 26 is determined on the basis of several conditions to be described below.

In a case where the outside air enthalpy EOA is smaller is than the return air enthalpy ERE (Y-branch in S120) and the outside air dry-bulb temperature TdbOA is lower than the return air dry-bulb temperature TdbRE (Y-branch in S121) and the supply air relative humidity RHSA is smaller than an upper limit value (Y-branch in S122), the outside air fan 27b and the exhaust fan 28b are activated and the outside air damper 27a and the exhaust damper 28a are opened (S123). In a case where the return air damper 29 is separately provided, the return air damper 29 is also closed. This means that the outside air cooling means 26 is utilized. The "upper limit value" used herein is a predetermined value. This is set because condensation may be generated in the server rack 20 if cold outside air is introduced when the supply air relative humidity RHSA is high.

In a case where the supply air relative humidity RHSA is smaller than a lower limit value for a certain period of time (Y-branch in S124), the humidifier 13 is activated (S125). This is done to prevent the generation of static electricity and the resulting breakdown of the components in the server. In a case where the supply air relative humidity RHSA is greater than or equal to the lower limit value for the certain period of time (N-branch in S124), the humidifier 13 is deactivated (S126).

In a case where the outside air cooling means 26 is utilized, the cooling level of the air conditioner 22 is set to zero and only the blower fan is rotated. In this case, since the compressor and the like in the air conditioner 22 can be deactivated, power consumption by the air conditioner 22 can be reduced significantly.

Returning to the step S120, in a case where the outside air enthalpy EOA is greater than or equal to the return air enthalpy ERE (N-branch in S120) or the outside air dry-bulb temperature TdbOA is higher than or equal to the return air dry-bulb temperature TdbRE (N-branch in S121) or the supply air relative humidity RHSA is greater than or equal to the upper limit value (N-branch in S122), on the other hand, the outside air fan 27b and the exhaust fan 28b are deactivated and the outside air damper 27a and the exhaust damper 28a are closed. In a case where the return air damper 29 is provided, the return air damper 29 is opened (S127). Such a condition indicates that the outside air cooling means 26 is not utilized.

Figure 12:
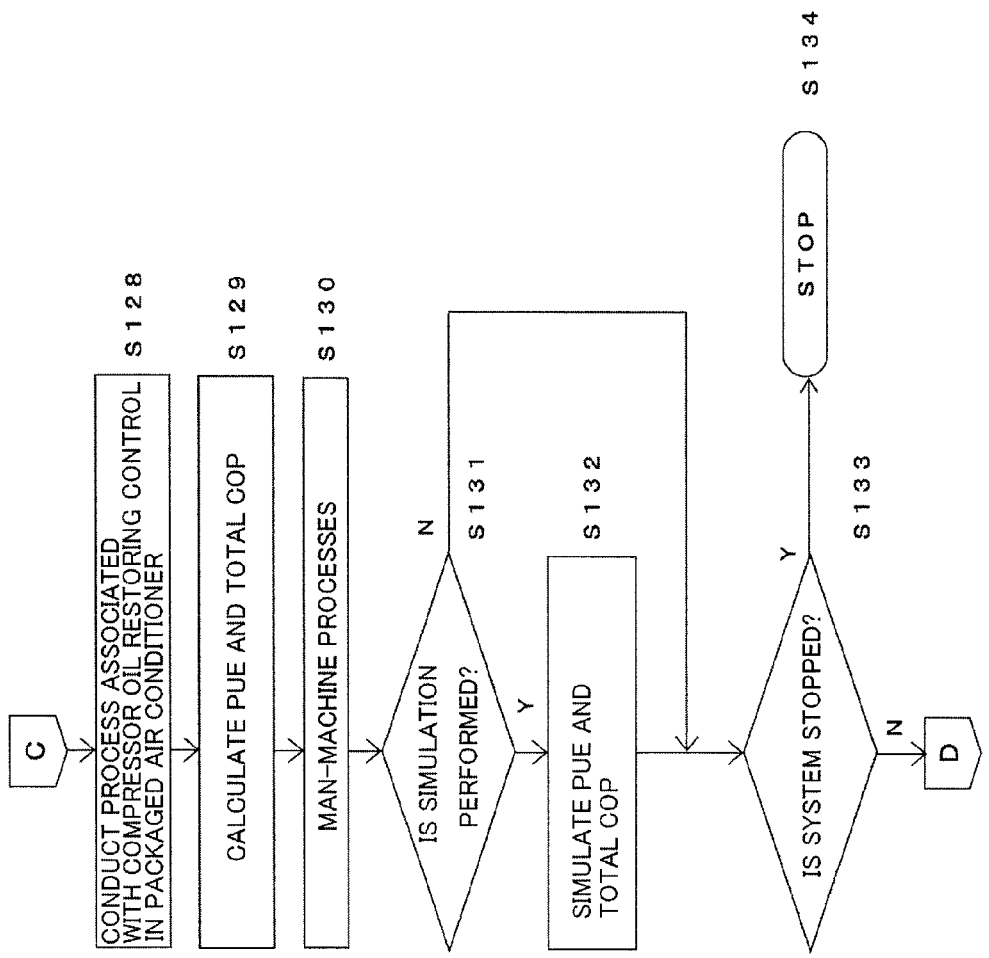
FIG. 12 is a chart showing the process flow of the server cooling system 1.

With reference to FIG. 12, a process when the oil restoring control is conducted in the compressor of the packaged air conditioner 22 is performed in step S128. If the oil restoring operation notification signal Sa, which is an indication of a state where the compressor oil restoring control is in execution, is received from the packaged air conditioner 22, the thermosiphon 24 is forced to stop until such a control executed-state signal is terminated. Also, a cooling capacity request signal to the packaged air conditioner 22 is terminated, and cooling performed by the outside air cooling means 26 is stopped (S128).

When the compressor oil restoring control is executed, the cooling capacity of the packaged air conditioner 22 is temporarily maximized. This is due to neither a temperature increase in the heat source nor an increase in the outside air temperature. Thus, the temperature of the cold air turns out to be too low. Therefore, if the cooling capacity request signal is valid, the packaged air conditioner 22 detecting such a condition increases the temperature. In this way, since the detection speed for a temperature change is faster than the response of the cooling capacity of the packaged air conditioner 22, hunting occurs. Therefore, if the compressor oil restoring operation notification signal Sa is received, the cooling function is temporarily deactivated.

Alternatively, when the power consumption by the packaged air conditioner 22 (WH_PAC) is instantaneously reached to the maximum power consumption, it can be concluded that the compressor oil restoring control has been executed in the packaged air conditioner 22. In this case, the thermosiphon 24 is forced to stop until a certain period of time elapses. Also, the cooling capacity request signal to the packaged air conditioner 22 is terminated, and cooling performed by the outside air cooling means 26 is stopped.

Next, the PUE and the total COP are calculated (S129). More specifically, the PUE is calculated from the received power WH_RCV and the server rack power consumption WH_RAC with Expression (1).

$$PUE = WH\_RCV/WH\_RAC \quad (1)$$

The total COP (COP_TOTAL) is calculated as follows where: WH_RAC denotes server rack power consumption; WH_PAC denotes packaged air conditioner power consumption; WH_TS denotes thermosiphon power consumption; WH_FMOA denotes a rated power of the outside air fan; and WH_FMEX denotes a rated power of the exhaust fan.

First, in a case where it is determined that the outside air cooling can be performed on the basis of the comparison operations for the outside air cooling, the total COP is obtained with Expression (2).

$$COP\_TOTAL = WH\_RAC/(WH\_PAC + WH\_TS + WH\_FMOA + WH\_FMEX) \quad (2)$$

In a case where it is determined that the outside air cooling cannot be performed on the basis of the comparison operations for the outside air cooling, the total COP is obtained with Expression (3).

$$COP\_TOTAL = WH\_RAC/(WH\_PAC + WH\_TS) \quad (3)$$

Next, the man-machine devices 30m (a display device and a keyboard, for example) are connected to the control device 30 to perform data input and display (S130). For the data input, model-corresponding constants in the real COP_PAC (coefficient of performance of the packaged air conditioner 22) characteristic formula, model-corresponding constants and correction coefficients in the corrected COP_TS (coefficient of performance of the thermosiphon 24) characteristic formula, outside air temperature and humidity monthly data corresponding to different cities, and the like (which will be described in relation to FIGS. 13A and 13B and 14A and 14B) are inputted. The inputted information is stored in the memory of the control device 30 and referred to in the calculation execution process.

For the display of device conditions, device conditions of the packaged air conditioner 22, the thermosiphon 24, the outside air fan 27b and the outside air damper 27a, the exhaust fan 28b and the exhaust damper 28a (the return air damper 29 may be added), and the humidifier 13 are displayed with graphics in a visually easy-to-understand manner.

For the display of data, current values of various measured data about the supply air dry-bulb temperature TdbSA, the supply air relative humidity RHSA, the return air dry-bulb temperature TdbRE, the return air relative humidity RHRE, the outside air dry-bulb temperature TdbOA, the outside air relative humidity RHOA, the evaporator inlet temperature TdEV1 and the evaporator outlet temperature TdEV2 of the thermosiphon 24, the power consumption by the packaged air conditioner 22 (WH_PAC), the power consumption by the thermosiphon 24 (WH_TS), and the power consumption in the server rack 20 (WH_RAC) are numerically displayed. A history trend graph may also be displayed in order to facilitate the understanding of the trend.

For the display of calculations, the coefficient of performance (real COP_PAC) and coolable heat quantity Q_PAC of the packaged air conditioner 22, the coefficient of performance (corrected COP_TS) and coolable heat quantity Q_TS of the thermosiphon 24, the outside air enthalpy EOA, the return air enthalpy ERE, the outside air coolable heat quantity Q_OA, and the current values, average values, minimum values, and maximum values of the PUE and total COP, which are indexes about cooling energy efficiency, are numerically displayed. A history trend graph may also be displayed in order to facilitate the trend analysis about the energy efficiency. Such a trend analysis makes it possible to extract a factor to realize a higher energy efficiency and to revise constants in the COP (which are various coefficients of performance) characteristic formulas.

It may be allowed to simulate how much PUE can be realized depending on an installation place of the server cooling system 1 (Y-branch in step S131). As described above, the server cooling system 1 cools the server rack 20 by means of the air conditioner 22, the thermosiphon 24, and the outside air cooling means 26. It can be said that whether to use these cooling methods is determined depending on the amount of heat generation in the server rack 20, the outside air temperature, and the outside air humidity.

Thus, if yearly average temperature and humidity data at the place where the server cooling system 1 is installed is available, it is possible to simulate how much PUE can be realized throughout the year (S132). The detail of this simulation will be described later. In a case where the simulation has been completed or no simulation is performed, a stop determination is made (S133). If it is determined to stop (Y-branch in S133), the first process flow is stopped (S134). If it is determined to continue (N-branch in S133), the control is returned to immediately before the step S102 in FIG. 9. Note that the first process flow may also be set in such a manner that it can be forcibly stopped by another interrupt.

As described above, the server cooling system 1 of the present embodiment obtains the respective coolable heat quantities and coefficients of performance from the outside air temperature and humidity, the return air temperature and humidity in the hot aisle 10h, the supply air temperature and humidity in the cold aisle 10c, and the power consumption by the air conditioner 22 and the power consumption by the thermosiphon 24. Then, the server cooling system 1 makes appropriate selections and adjustments so as to be able to cool the server rack 20 with a minimum power.

<Simulation>

The PUE simulation to be performed in the step S132 in the first process flow by the control device 30 will now be described. The simulation method is almost the same as the first process flow by the control device 30. In place of the measured values, values recorded in databases are employed.

The model-corresponding constants in the characteristic formulas of the packaged air conditioner 22 and the thermosiphon 24 described above and monthly outside air temperatures and humidities for different cities are stored in the control device 30 as databases. As examples, FIG. 13A shows a database of the thermosiphon 24 and FIG. 13B shows a database of the packaged air conditioner 22. Later-described parameters (a1, a2, b, and C) to be used when calculating the coolable heat quantities are listed for different models.

FIGS. 14A and 14B show, as an example, a database of monthly outside air temperatures and humidities for different cities. In FIG. 14A, city names classified according to regional codes are recorded along with regional names and country names. For each of the regional codes, monthly data shown in FIG. 14B is recorded. The monthly data may include temperature and humidity maximum values, average values, and minimum values.

Condition settings about the maximum value, minimum value, and average value of the monthly cooling load, i.e., power consumption in the server rack 20 (WH_RAC), the evaporator inlet temperature TdEV1 of the thermosiphon 24 corresponding to the power consumption in the server rack 20 (WH_RAC), the return air dry-bulb temperature TdbRE and the return air relative humidity RHRE corresponding to the power consumption in the server rack 20 (WH_RAC), the outside air introduced amount q, the rated power consumption of the outside air fan 27b and that of the exhaust fan 28b, and the power consumption by an incidental equipment such as lighting are performed as condition settings for the simulation.

If the simulation is executed after selecting models of the packaged air conditioner 22 and the thermosiphon 24 and a city, the model-corresponding constants in the characteristic formulas and the monthly outside air temperature and humidity data corresponding to the city are extracted. A monthly reference COP_TS of the thermosiphon 24 (see Expression (14)) is calculated from a characteristic formula by using the extracted monthly outside air temperature as a variable and the extracted constant.

Then, the real COP_TS of the thermosiphon 24 is obtained from the reference COP_TS with the evaporator inlet temperature TdEV1 of the thermosiphon 24 set in the condition settings. This real COP_TS is the real ability of the thermosiphon 24 itself. Note however that the coefficient of performance of the thermosiphon 24 varies depending on how it is installed. Thus, the coefficient of performance of the thermosiphon 24 in an actually-operated state is obtained with a correction value. This is referred to as the corrected COP_TS (see Expression (16)). The numerical value obtained by multiplying the rated power consumption of the thermosiphon 24 by the corrected COP_TS is equal to the coolable heat quantity of the thermosiphon 24 (Q_TS) (see Expression (20)).

Alternatively, the reference COP_TS may be corrected with the evaporator inlet temperature TdEV1 of the thermosiphon 24 corresponding to the power consumption in the server rack 20 (WH_RAC) to obtain the real COP_TS. A monthly reference COP of the packaged air conditioner 22 (reference COP_PAC) may be calculated with a characteristic formula by using the extracted monthly outside air temperature as a variable and the extracted constant. Then, the reference COP_PAC may be corrected with the return air wet-bulb temperature TwbRE calculated from the return air dry-bulb temperature TdbRE and the return air relative humidity RHRE corresponding to the power consumption in the server rack 20 (WH_RAC) to obtain the real COP_PAC.

The outside air enthalpy EOA and the return air enthalpy ERE are calculated with the monthly outside air temperature, outside air relative humidity RHOA, return air dry-bulb temperature TdbRE, and return air relative humidity RHRE used as variables. Then, the difference value between the outside air enthalpy EOA and the return air enthalpy ERE is multiplied by the outside air introduced amount q and the air density $\rho$ to obtain the outside air coolable heat quantity QOA (see Expression (28)).

The coolable heat quantity of the thermosiphon 24 (Q_TS) is subtracted from the cooling load Q_L, i.e., the power consumption in the server rack 20 (WH_RAC). In a case where the outside air dry-bulb temperature TdbOA is lower than the return air dry-bulb temperature TdbRE and the calculated outside air enthalpy EOA is smaller than the calculated return air enthalpy ERE and the supply air relative humidity RHSA is smaller than the preset upper limit value, it is determined that the outside air cooling can be performed. Therefore, the outside air coolable heat quantity Q_OA is also subtracted from the cooling load and the remaining heat quantity is defined as the heat quantity to be cooled by the packaged air conditioner 22 (Q_PAC2).

The power value obtained by dividing the calculated coolable heat quantity of the packaged air conditioner 22 (Q_PAC) by the calculated real COP_PAC of the packaged air conditioner 22 is defined as the power consumption by the packaged air conditioner 22 (WH_PAC).

The power consumption by the packaged air conditioner 22 (WH_PAC) is added to the rated power consumption of the thermosiphon 24. In a case where it is determined that the outside air cooling can be performed on the basis of the comparison operations for the outside air cooling, the rated powers of the outside air fan 27b and the exhaust fan 28b and the power consumption by the incidental equipment such as lighting are further added thereto. The thus obtained power consumption is defined as the equipment total power consumption.

The PUE, which is an index about cooling energy efficiency in a datacenter, is obtained from Expression (4).

$$PUE = (\text{equipment total power consumption} + \text{server rack power consumption})/\text{server rack power consumption} \quad (4)$$

The total COP as the server cooling system 1 is calculated as follows.

In a case where it is determined that the outside air cooling can be performed on the basis of the comparison operations for the outside air cooling, such a total COP is obtained from Expression (5).

$$\text{Total } COP = \text{server rack power consumption}/(\text{packaged air conditioner power consumption} + \text{thermosiphon power consumption} + \text{outside air fan rated power} + \text{exhaust fan rated power}) \quad (5)$$

In a case where it is determined that the outside air cooling cannot be performed on the basis of the comparison opera tions for the outside air cooling, the total COP is obtained from Expression (6).

$$\text{Total } COP = \text{server rack power consumption}/(\text{packaged air conditioner power consumption}+\text{thermosiphon power consumption}) \quad (6)$$

The maximum values, minimum values, and average values of monthly and yearly PUEs and total COPs are obtained as described above. This means that it is possible to simulate how much PUE can be achieved by selecting the models of the thermosiphon 24 and the packaged air conditioner 22 and specifying the installation place (city name) of the server cooling system 1. Therefore, the computationally-estimated PUE and the currently-realized PUE can be compared to each other. This helps to analyze a reason when the PUE is failing to realize the simulated value.

Figure 15:
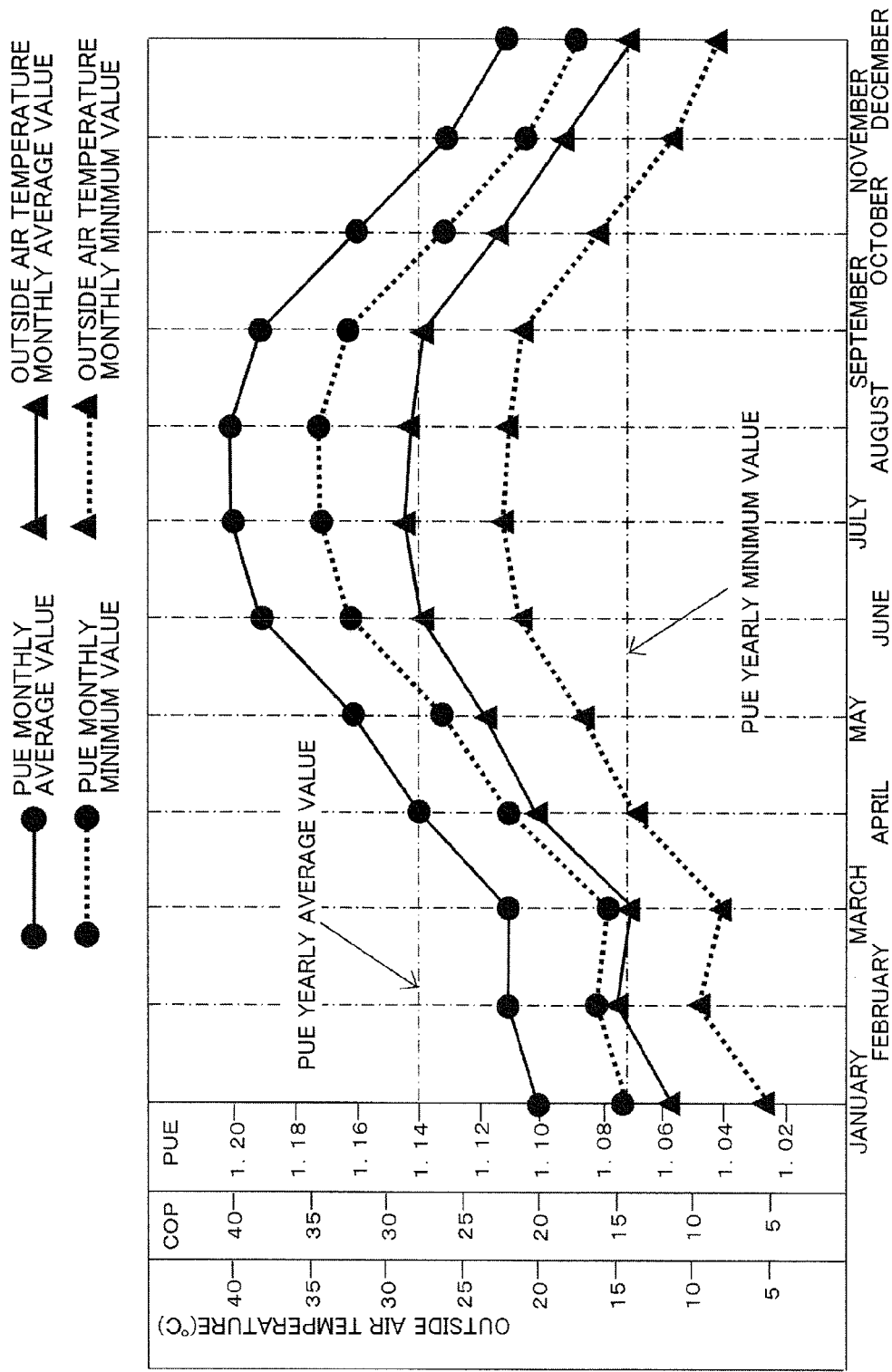
FIG. 15 is a graph showing exemplary simulation results using the respective databases.

FIG. 15 shows an example of the simulation results. The vertical axis thereof shows outside air temperatures, coefficient of performance COPs, and PUEs, whereas the horizontal axis thereof shows months. A black circle solid line shows PUE monthly average values and a black circle dotted line shows PUE monthly minimum values. Note that a PUE yearly average value and a PUE yearly minimum value are shown in the graph.

As described above, the server cooling system 1 has many factors influenced by the outside air temperature and humidity. Therefore, there is no point in trying to lower the PUE aimlessly. If it is possible to simulate to what extent the PUE can be lowered with the current device and the environment at the installation place thereof, it becomes possible to keep a good balance between cost and energy conservation.

<Methods for Obtaining Calculated Values>

In the description of the first process flow by the control device 30, the coefficients of performance and coolable heat quantities of the air conditioner 22, the thermosiphon 24, and the outside air cooling means 26 were used. These values are calculated with the values obtained from the temperature sensors and the humidity sensors provided at various places of the server cooling system 1 and with known relational expressions. The calculation methods will be described below in detail.

<Calculation for Coefficient of Performance>

While a coefficient of performance is a coolable heat quantity per a consumed power, it can be calculated from measurable observed values such as an outside air temperature and a return air temperature. Thus, the coolable heat quantity can be calculated and it is possible to determine which cooling means can control cooling most efficiently (i.e., with the lowest power consumption) for the required coolable heat quantity. Calculations for the coefficients of performance in the different cooling means will be described below in detail.

<Coefficient of Performance COP_PAC and Coolable Heat Quantity Q_PAC of Air Conditioner>

If a reference coefficient of performance when the return air wet-bulb temperature TwbRE is 20° C. is defined as COP_PAC20 (reference COP_PAC), the coefficient of performance of the air conditioner 22 (real COP_PAC) is approximated with Expression (7).

$$\text{Real } COP\_PAC = b \times TwbRE/20 \times COP\_PAC20 \quad (7)$$

The "b" denotes a proportionality constant and is a numerical value obtained in advance by experiments or the like.

If the return air wet-bulb temperature TwbRE can be directly observed, the observed value can be used. However, the return air wet-bulb temperature TwbRE is usually difficult to be observed directly. Thus, it is obtained by a calculation from the return air dry-bulb temperature TdbRE and the return air relative humidity RHRE.

First, a saturated water vapor pressure Pws is calculated as follows with the Wexler-Hyland expression.

(1) In a case where the return air dry-bulb temperature TdbRE is higher than or equal to the triple point of water (0.01° C.) and no freezing occurs at the triple point of water (0.01° C.), the Pws is calculated as follows where the absolute temperature K=TdbRE+273.15 [K].

$$Pws = \exp(-5800.2206/TdbRE + 1.3914993 - 0.048640239 \times K + 0.41764768 \times 10^{-4} \times K^2 - 0.14452093 \times 10^{-7} \times K^3 + 6.5459673 \times Ln(K))/1000 \text{ [kPa]} \quad (8)$$

(2) In a case where the dry-bulb temperature Tdb is lower than the triple point of water (0.01° C.) or in the case of a frozen state, the Pws is calculated as follows.

$$Pws = \exp(-5674.5359/TdbRE + 6.3925247 - 0.9677843 \times 10^{-2} \times K + 0.62215701 \times 10^{-6} \times K^2 + 0.20747825 \times 10^{-8} \times K^3 + 0.9484024 \times 10^{-12} \times K^4 + 4.1635019 \times Ln(K))/1000 \text{[kPa]} \quad (9)$$

Note that the Ln denotes a natural logarithm.

A water vapor partial pressure Pwd is calculated from the saturated water vapor pressure Pws (kPa) obtained above and the return air relative humidity RHRE (°CWB) with Expression (10).

$$\text{Water vapor partial pressure } Pwd = Pws \times RHRE/100 \text{ [kPa]} \quad (10)$$

A dew-point temperature Tdp is obtained from Expression (11) with the water vapor partial pressure Pwd (kPa) used as a variable.

$$\text{Dew-point temperature } Tdp = 273.3/((7.5/(Ln(Pwd/6.11)/Ln(10)))-1) \quad (11)$$

The return air wet-bulb temperature TwbRE is obtained from the Sprung formula by means of a convergence calculation with the Newton's method using the following constants and variables. The following convergence calculation is performed where Twb1 and Twb2 denote the wet-bulb temperature calculation buffer variables; Pwd1 denotes the water vapor pressure calculation buffer variable; atmospheric pressure P0=101.325 [kPa]; and the return air dry-bulb temperature TdbRE, the water vapor partial pressure Pwd, and the dew-point temperature Tdp are used as variables. The TwdRE at convergence is taken as the sought wet-bulb temperature.

Initial setting:

$$Twb1 = -273.15$$

$$Twb2 = TdbRE$$

Convergence calculation loop:

$$TwbRE = (Twb1 + Twb2)/2$$

$$Tdp = 6.11 \times 10^{\wedge}(7.5 \times TwbRE/(237.3 + TwbRE))$$

$$Pwd1 = Tdp - 0.0008 \times P0 \times 10 \times (TdbRE - TwbRE)$$

If Pwd>=Pwd1, Twb1=TwbRE.
If Pwd<Pwd1, Twb2=TwbRE.
If |Pwd−Pwd1|>0.00000001, return to the convergence calculation loop.
The convergence calculation loop ends.

The COP_PAC20 (reference COP_PAC) is approximated with Expression (12) with the outside air dry-bulb temperature TdbOA used as a variable.

$$COP\_PAC20 = a1 \times TdbOA^2 + a2 \times TdbOA + a3 \quad (12)$$

Note that the a1, the a2, and the a3 denote proportionality constants illustrated also in FIGS. 13A and 13B and obtained in advance by experiments or the like.

In the above-described manner, the return air wet-bulb temperature TwbRE is obtained by the convergence calculation and the COP_PAC20 can be obtained from the outside air dry-bulb temperature TdbOA. The real COP_PAC can be calculated by substituting these values in Expression (7). If the power consumption by the air conditioner 22 is denoted by WH_PAC, the coolable heat quantity of the air conditioner 22 (Q_PAC) can be obtained from the following Expression (13).

$$Q\_PAC = WH\_PAC \times \text{real } COP\_PAC \quad (13)$$

<Coefficient of Performance COP_TS and Coolable Heat Quantity Q_TS of Thermosiphon>

If a reference COP when the evaporator inlet temperature TdEV1 is 40° C. is defined as COP_TS40, the real COP_TS, which is the COP of the thermosiphon 24 itself, is approximated with the following Expression (14).

$$\text{Real } COP\_TS = b' \times TdEV1/40 \times COP\_TS40 \quad (14)$$

The "b'" herein denotes a proportionality constant obtained in advance by experiments or the like. Note that the coefficient of performance obtained with Expression 14 is referred to as the "real COP_TS."

Also, the COP_TS40 is approximated by Expression (15) with the outside air dry-bulb temperature TdbOA used as a variable.

$$COP\_TS40 = a1' \times TdbOA^2 + a2' \times TdbOA + a3' \quad (15)$$

Note that the a1', the a2', and the a3' denote proportionality constants obtained in advance by experiments or the like.

In the above-described manner, the coefficient of performance of the thermosiphon 24 itself (real COP_TS) is obtained. The efficiency of the thermosiphon 24, by the way, is heavily dependent on the air flow passing through the evaporator 24a. Therefore, it is desired to obtain the real coefficient of performance of the thermosiphon 24 in an actually-installed state. It is because whether to operate the thermosiphon 24 is determined on the basis of the coefficient of performance of the thermosiphon 24 (see the step S110 in the <First process flow> section).

The real COP_TS obtained with Expression (14) is the real ability of the thermosiphon 24 itself. Therefore, installing the server rack 20 on the boundary between the hot aisle 10h and the cold aisle 10c does not always enable the thermosiphon 24 to operate at the real COP_TS. Rather, the coefficient of performance of the thermosiphon 24 in an actually-operated state is typically smaller than the real COP_TS. Thus, the real COP_TS is corrected so as to be the coefficient of performance in an actually-operated state with the correction coefficient α. The thus obtained COP is defined as the "corrected COP_TS."

The corrected COP_TS is obtained as in Expression (16) by multiplying the real COP_TS by the correction coefficient.

$$\text{Corrected } COP\_TS = \alpha \times \text{real } COP\_TS \quad (16)$$

There are some possible methods to obtain the correction coefficient α. For example, an evaporator inlet temperature TdEV1 for the case of a favorable exhaust temperature distribution of the server rack 20 as shown in FIG. 6 is obtained in advance. Then, an evaporator outlet temperature TdEV2 for the case of an exhaust temperature distribution of the server rack 20 as shown in FIG. 4, with which the COP is lowered, is measured. Note that the temperature is obtained by calculating an average value of temperatures at a plurality of points at the evaporator inlet. Then, a correction coefficient α1 is obtained with Expression (17).

$$\alpha 1 = TdEV2/TdEV1 \quad (17)$$

In a case where a mixed amount of low-temperature exhaust is greatly varied when a server load factor changes, an evaporator inlet temperature TdEV1 for the case of a favorable exhaust temperature distribution of the server rack 20 as shown in FIG. 6 is obtained in advance. Then, an evaporator inlet temperature TdEV3 when the server load factor is changed is measured. Then, a correction coefficient α2 is obtained with Expression (18).

$$\alpha 2 = TdEV3/TdEV1 \quad (18)$$

It is also preferred to obtain a correction coefficient α3 from the "installed COP_TS" obtained in the <Determining degree of opening in gallery> section and the real COP_TS. This is because the installed COP_TS is the very value obtained by adjusting the degree of opening for the opening 18b of the gallery 18 so as to obtain the highest value in the installed state of the thermosiphon 24. This is also because the flow is produced on the basis of an assumption that the correction coefficient α exists in a case where simulation is performed. Herein, the correction coefficient α3 is obtained with Expression (19).

$$\alpha 3 = \text{installed } COP\_TS/\text{real } COP\_TS \quad (19)$$

The corrected COP_TS is obtained from Expression (16) with the above-described correction coefficients α1 to α3 used as the correction coefficient α. If the power consumption by the thermosiphon 24 is defined as WH_TS, the coolable heat quantity Q_TS can be obtained from Expression (20) with the corrected COP_TS obtained as described above.

$$Q\_TS = WH\_TS \times \text{corrected } COP\_TS \quad (20)$$

<Coolable Heat Quantity of Outside Air Cooling Means (Q_OA)>

An outside air saturated water vapor pressure PwsOA is obtained by using the outside air dry-bulb temperature TdbOA instead of the return air dry-bulb temperature TdbRE in Expression (8) or Expression (9). Then, an outside air water vapor partial pressure PwdOA is obtained by using the outside air saturated water vapor pressure PwsOA and the outside air relative humidity RHOA instead of the saturated water vapor pressure Pws and the return air relative humidity RHRE in Expression (10). These will be described below in a specific manner.

First, the outside air saturated water vapor pressure PwsOA is calculated as follows with the Wexler-Hyland expression.

(1) In a case where the outside air dry-bulb temperature TdbOA is higher than or equal to the triple point of water (0.01° C.) and no freezing occurs at the triple point of water (0.01° C.), the PwsOA is calculated as follows where the absolute temperature K=TdbOA+273.15 [K].

$$PwsOA = \exp(-5800.2206/TdbOA + 1.3914993 - 0.048640239 \times K + 0.41764768 \times 10^{-4} \times K^2 - 0.14452093 \times 10^{-7} \times K^3 + 6.5459673 \times Ln(K))/1000 \text{ [kPa]} \quad (21)$$

(2) In a case where the dry-bulb temperature Tdb is lower than the triple point of water (0.01° C.) or in the case of a frozen state, the PwsOA is calculated as follows.

$$PwsOA = \exp(-5674.5359/TdbOA + 6.3925247 - 0.9677843 \times 10^{-2} \times K + 0.62215701 \times 10^{-6} \times K^2 + 0.20747825 \times 10^{-8} \times K^3 + 0.9484024 \times 10^{-12} \times K^4 + 4.1635019 \times Ln(K))/1000 [kPa] \quad (22)$$

Note that the Ln denotes a natural logarithm.

The outside air water vapor partial pressure PwdOA is calculated from the outside air saturated water vapor pressure PwsOA (kPa) obtained above and the outside air relative humidity RHOA (°CWB) with Expression (23).

$$\text{Outside air water vapor partial pressure } PwdOA = PwsOA \times RHOA/100 [kPa] \quad (23)$$

The dew-point temperature Tdp is obtained from Expression (24) with the outside air water vapor partial pressure PwdOA (kPa) used as a variable.

$$\text{Dew-point temperature } Tdp = 273.3/((7.5/(\mathrm{Ln}(PwdOA/6.11)/\mathrm{Ln}(10)))-1) \quad (24)$$

The outside air wet-bulb temperature TwbOA is obtained from the Sprung formula by means of a convergence calculation with the following Newton's method using the following constants and variables. The convergence calculation is performed where Twb1 and Twb2 denote the wet-bulb temperature calculation buffer variables; Pwd1 denotes the water vapor pressure calculation buffer variable; atmospheric pressure P0=101.325 [kPa]; and the outside air dry-bulb temperature TdbOA, the outside air water vapor partial pressure PwdOA, and the dew-point temperature Tdp are used as variables.

Initial setting:

$$Twb1 = -273.15$$

$$Twb2 = TdbOA$$

Convergence calculation loop:

$$TwbOA = (Twb1+Twb2)/2$$

$$Tdp = 6.11 \times 10^{\wedge}(7.5 \times TwbOA/(237.3+TwbOA))$$

$$Pwd1 = Tdp - 0.0008 \times P0 \times 10 \times (TdbOA - TwbOA)$$

If PwdOA>=Pwd1, Twb1=TwbOA.
If PwdOA<Pwd1, Twb2=TwbOA.
If |Pwd−Pwd1|>0.00000001, return to the convergence calculation loop.
The convergence calculation loop ends.

Next, an outside air absolute humidity XOA is calculated with the following Expression (25).

$$\text{Outside air absolute humidity } XOA = (Mv/Ma) \times PwdOA/(P0-PwdOA)[kg/kg(DA)] \quad (25)$$

The Ma denotes the molecular weight corresponding to dry air (28.9645 [kg/kmol]).

The Mv denotes the molecular weight of water vapor (18.01534 [kg/kmol]).

The P0 denotes the atmospheric pressure (101.325 [kPa]).

The outside air enthalpy EOA is obtained with the following Expression (26) using the outside air absolute humidity XOA.

$$\text{Outside air enthalpy } EOA = Cp \times Tdb + (Cw \times TdbOA + Qw) \times XOA/4.186 [kJ/kg(DA)] \quad (26)$$

The Cp denotes the specific heat at constant pressure for dry air (1.006 [kJ/kg·K]).

The Cw denotes the specific heat at constant pressure for water vapor (1.846 [kJ/kg·K]).

The Qw denotes an evaporative latent heat for water (2501 [kJ/kg]).

A return air water vapor partial pressure PwdRE is obtained by substituting the outside air dry-bulb temperature TdbOA with the return air dry-bulb temperature TdbRE and a return air overall temperature XRE is obtained. Then, the return air enthalpy ERE is obtained with the following Expression (27).

$$\text{Return air enthalpy } ERE = Cp \times Tdb + (Cw \times TdbRE + Qw) \times XRE/4.186 [kJ/kg(DA)] \quad (27)$$

A heat quantity obtained by multiplying the difference value between the outside air enthalpy EOA and the return air enthalpy ERE by the outside air introduced amount q [m³/h] and the air density ρ [kg/m³] is equal to the outside air coolable heat quantity Q_OA. It is calculated with Expression (28).

$$Q\_OA = 1.293 \times q \times (EOA - ERE)[kJ/h] \quad (28)$$

When the outside air coolable heat quantity Q_OA is converted into power consumption, power consumption WH_OA is calculated with Expression (29).

$$WH\_OA = Q\_OA/3600 [kW] \quad (29)$$

<PUE>

The PUE of the server cooling system 1 is a ratio between the received power (WH_RCV) and the power consumption in the server rack 20 (WH_RAC). The PUE is obtained with Expression (30). Note that Expression (30) is the same as Expression (1).

$$PUE = WH\_RCV/WH\_RAC \quad (30)$$

Since the received power (WH_RCV) is equal to the sum of the power consumption in the server rack 20 (WH_RAC) and other power consumption in the cooling system, it is ideal that the PUE becomes equal to 1.0.

The server cooling system 1 has three kinds of cooling means, i.e., the outside air cooling means 26, the air conditioner 22, and the thermosiphon 24. In order to reduce power consumption by the cooling system as much as possible, however, it is inefficient to use all of the cooling means at all times. Thus, the respective cooling means are operated so as to reduce the PUE.

A heat quantity which can be removed by the cooling system is defined as a coolable heat quantity (Q_L). This is the same as the power consumption in the server rack 20 (WH_RAC). Herein, the coolable heat quantity can be also referred to as a cooling load.

$$Q\_L = WH\_RAC \quad (31)$$

The coolable heat quantity Q_L is made by the three cooling means, i.e., the air conditioner 22, the thermosiphon 24, and the outside air cooling means 26. If the respective coolable heat quantities are defined as Q_PAC, Q_TS, and Q_OA, the coolable heat quantity Q_L can be expressed as Expression (32).

$$Q\_L = Q\_PAC + Q\_TS + Q\_OA \quad (32)$$

The Q_PAC, the Q_TS, and the Q_OA are expressed as the following expressions with the power consumption by the air conditioner 22 defined as WH_PAC, the coefficient of performance of the air conditioner 22 defined as real COP_PAC, the power consumption by the thermosiphon 24 defined as WH_TS, the coefficient of performance of the thermosiphon 24 defined as corrected COP_TS, the power consumption by the outside air cooling means 26 defined as WH_OA, and the coefficient of performance of the outside air cooling means 26 defined as COP_OA.

$$Q\_PAC = WH\_PAC \times \text{real } COP\_PAC \quad (33)$$

$$Q\_TS = WH\_TS \times \text{corrected } COP\_TS \quad (34)$$

$$Q\_OA = WH\_OA \times COP\_OA \quad (35)$$

If the coefficients of performance influenced by the outside air temperature and the like can be obtained while assuming that the power consumption is equal to the rated power consumption, the coolable heat quantities by the respective cooling means can be calculated. Then, it becomes possible to find out which cooling means can be used for the currently-required coolable heat quantity in order to reduce the power consumption as much as possible.

(Second Embodiment)

Figure 16:
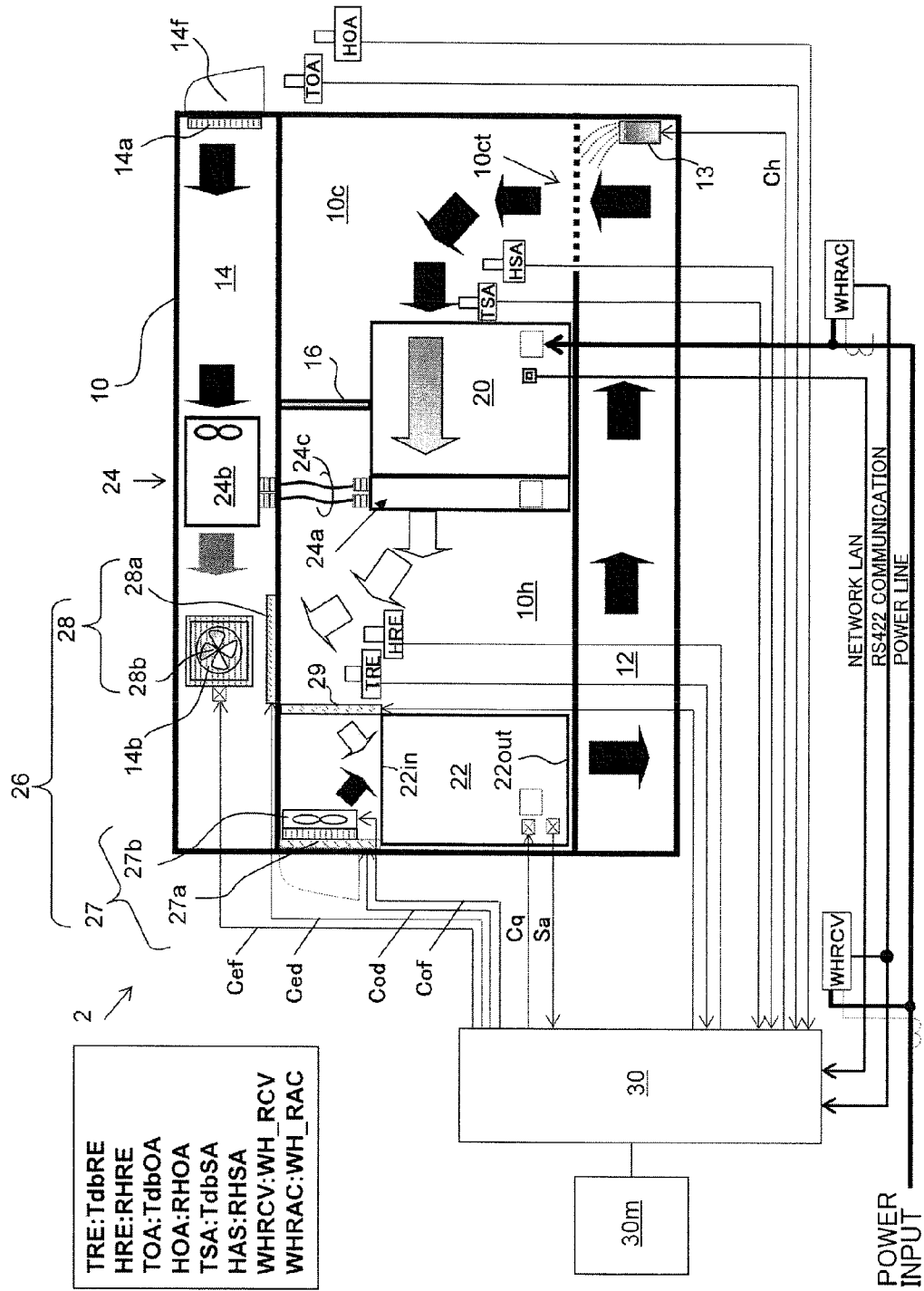
FIG. 16 is a diagram illustrating the configuration of a server cooling system 2.

The configuration of a server cooling system 2 according to the present embodiment is shown in FIG. 16. Elements identical to those in the first embodiment are denoted by the same reference numerals and the description thereof will be omitted. In comparison with the server cooling system 1, the packaged air conditioner power monitor WHPAC for monitoring the power consumption by the packaged air conditioner 22 (WH_PAC), the thermosiphon power monitor WHTS for monitoring the power consumption by the thermosiphon 24 (WH_TS), the thermosiphon evaporator inlet temperature sensor TTS1, and the thermosiphon evaporator outlet temperature sensor TTS2 are omitted in the server cooling system 2.

As shown in Expression (7) for the server cooling system 1, the real COP_PAC of the packaged air conditioner 22 is obtained by correcting the approximate characteristic formula using an outside air temperature as a variable with the return air wet-bulb temperature TwbRE to be varied with the power consumption in the server rack 20 (WH_RAC). As shown in Expressions (14), (15), and (16), the corrected COP_TS of the thermosiphon 24 is obtained by correcting the approximate characteristic formula using an outside air temperature as a variable with the evaporator inlet temperature TdEV1 of the thermosiphon 24 to be varied according to the power consumption in the server rack 20 (WH_RAC) and the temperature distribution at the back side of the server rack 20.

Therefore, the power consumption in the server rack 20 (WH_RAC) at which the real COP_PAC of the packaged air conditioner 22 and the corrected COP_TS of the thermosiphon 24 are equal to each other is obtained in an approximate characteristic formula of Expression (36) using the outside air dry-bulb temperature TdbOA as a variable.

$$WH\_RAC = c1 \times TdbOA^2 + c2 \times TdbOA + c3 \quad (36)$$

Figure 17:
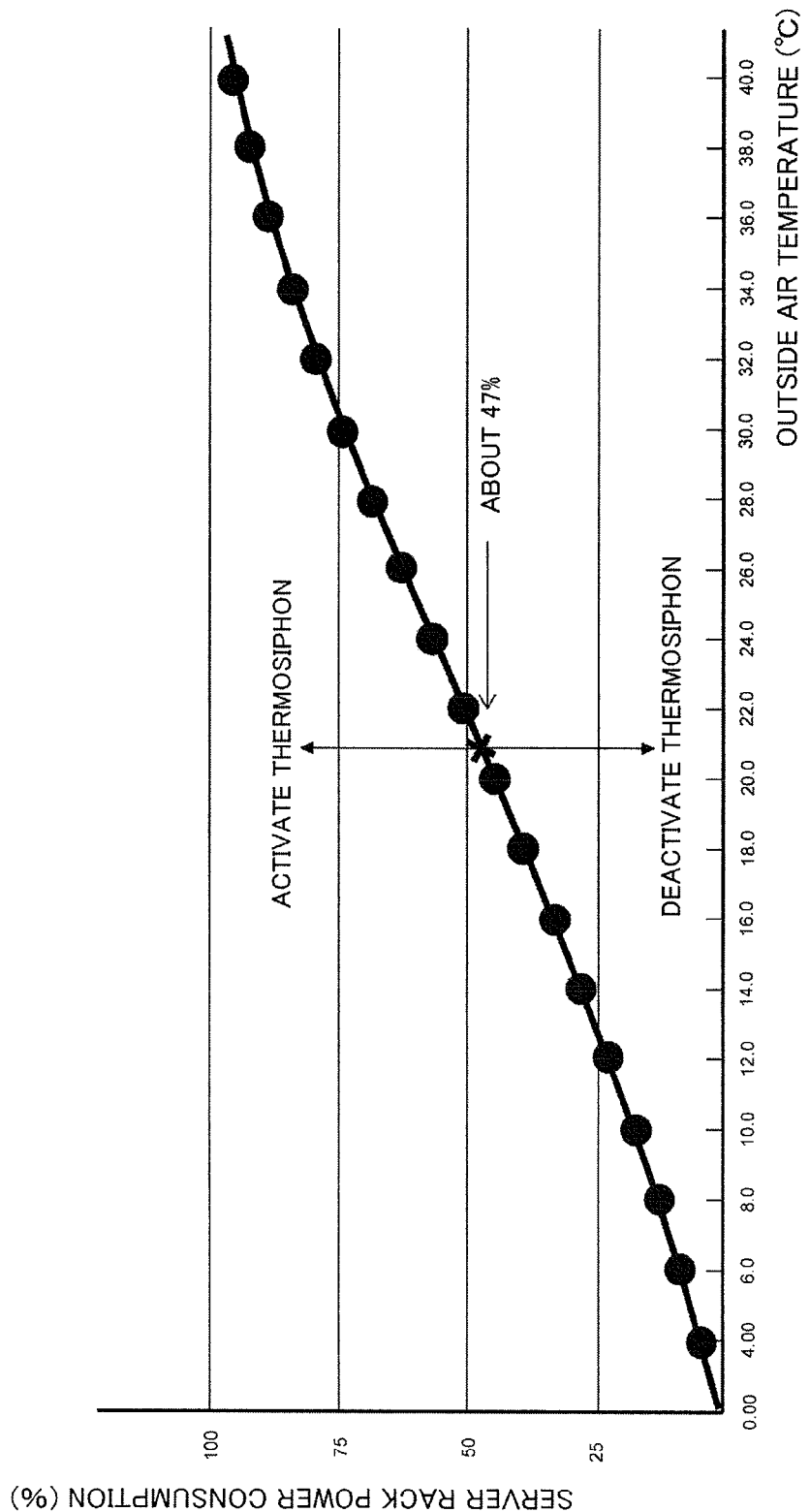
FIG. 17 is a graph for obtaining a point with which whether to use the thermosiphon is determined in the server cooling system 2.

The result is as shown in FIG. 17. In FIG. 17, the vertical axis shows power consumption in the server rack 20 (WH_RAC (%)) and the horizontal axis shows an outside air dry-bulb temperature TdbOA (° C.).

As a process made by the server cooling system 2, in determining whether to use the thermosiphon 24, when the server load is changed and the actual power consumption in the server rack 20 (WH_RAC) is thereby decreased below the numerical value calculated with Expression (31), the thermosiphon 24 is deactivated on the basis of the determination that the corrected COP_TS of the thermosiphon 24 is smaller than the real COP_PAC of the packaged air conditioner 22.

When the power consumption in the server rack 20 (WH_RAC) is greater than or equal to the numerical value calculated with Expression (31), the thermosiphon 24 is activated on the basis of the determination that the corrected COP_TS of the thermosiphon 24 is greater than or equal to the real COP_PAC of the packaged air conditioner 22.

Taking the graph of FIG. 17 as an example, when the outside temperature is 21.0° C., if the power consumption in the server rack 20 (WH_RAC) is greater than or equal to about 47%, the thermosiphon 24 is activated. If it is smaller than 47%, the thermosiphon 24 is deactivated.

The control accuracy of the server cooling system 2 is inferior to that of the server cooling system 1. Further, the server cooling system 2 cannot monitor the power consumption by the packaged air conditioner 22 (WH_PAC), the power consumption by the thermosiphon 24 (WH_TS), the thermosiphon evaporator inlet temperature TdEV1, and the thermosiphon evaporator outlet temperature TdEV2. However, the server cooling system 2 makes it possible to facilitate adjustments when installed at the site and to perform appropriate energy control without requiring logical and empirical skills.

Moreover, as compared to the server cooling system 1, the number of components is reduced and a low-grade device designed for simple calculations can be employed as the control device 30. Thus, a system capable of being standardized can be constructed at low cost as a whole.

<Optimization of Cooling Capacity for Packaged Air Conditioner>

The optimization of cooling capacity for the packaged air conditioner 22 will be described next. The packaged air conditioner 22 designed for use in a datacenter performs control for supply air temperatures, although it is performed also in the first embodiment. However, followability for the control is not so good. Thus, the cooling capacity is optimized by giving an instruction from the control device 30 to the packaged air conditioner 22 about the cooling capacity request level corresponding to the cooling load, i.e., the power consumption in the server rack 20 (WH_RAC).

Figure 18:
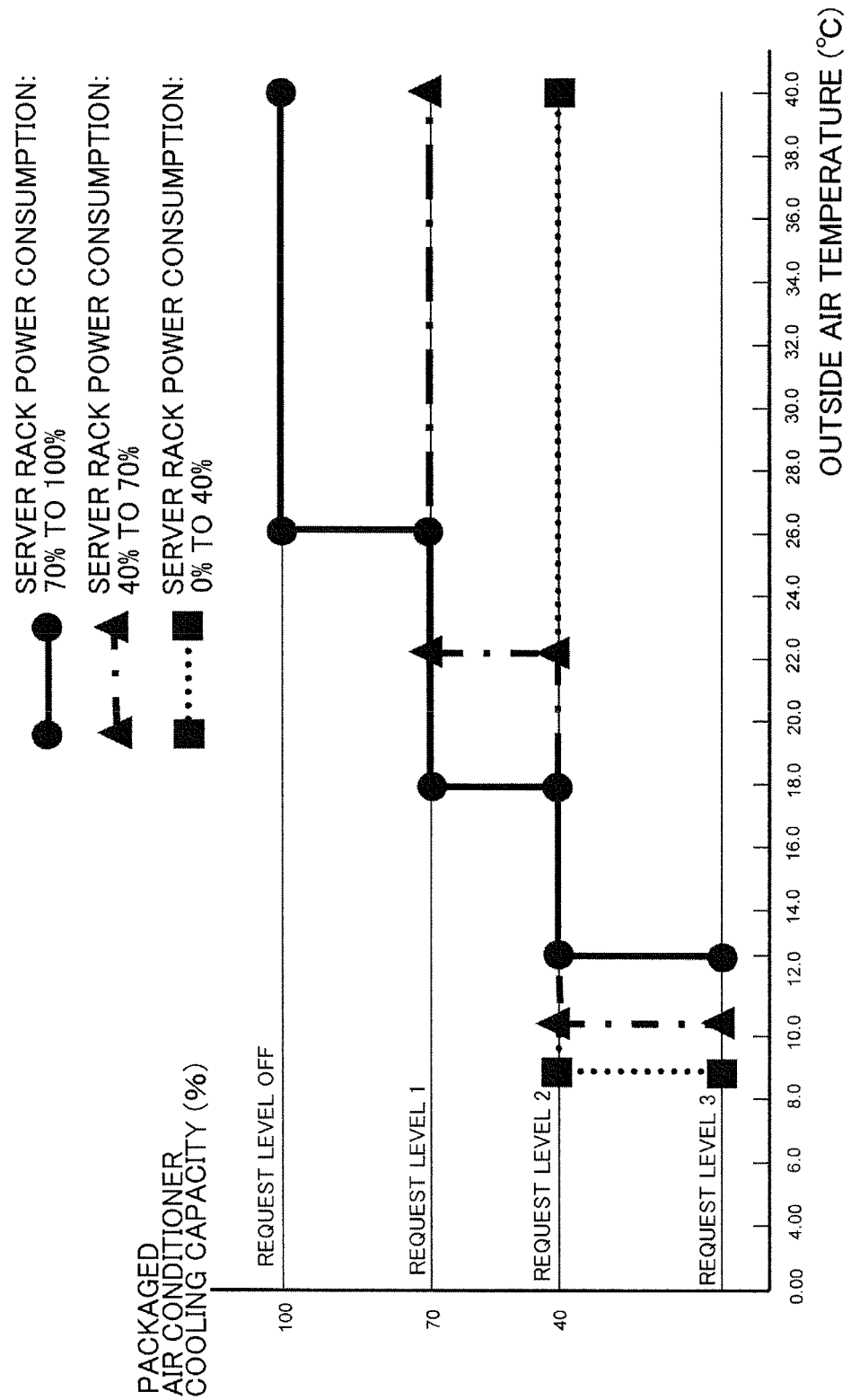
FIG. 18 is a timing chart showing how a cooling capacity of the packaged air conditioner is changed in accordance with a power used in the server rack.

FIG. 18 shows a case having four levels of cooling capacity in the packaged air conditioner 22. A request level OFF represents a rated operation. A request level 1 represents 70% of the rated operation. A request level 2 represents 40% of the rated operation. A request level 3 represents that only a circulation fan is operated and no cooling process is performed. That is to say, the four request levels can be set.

Based on demonstration data, a request level is changed in accordance with the outside air dry-bulb temperature TdbOA for each of ranges for the power consumption in the server rack 20 (WH_RAC) as a method making it possible to stabilize the controllability most in the relationship between the power consumption in the server rack 20 (WH_RAC) and the outside air dry-bulb temperature TdbOA. In FIG. 18, the entire range of the power consumption in the server rack 20 (WH_RAC) is divided into three ranges of 70% to 100%, 40% to 70%, and 0% to 40%. The four request levels are changed from one to another on the basis of the set outside air dry-bulb temperature TdbOA for each of the ranges for the power consumption in the server rack 20 (WH_RAC). In this manner, the cooling capacity of the packaged air conditioner 22 is optimized and a favorable condition for supply air temperature control is obtained.

Note however that if the supply air dry-bulb temperature TdbSA is kept to be higher than or equal to the set value for a certain period of time due to some reasons, a request level signal instructing the packaged air conditioner 22 to increase its cooling capacity is issued on the basis of the determination that the cooling capacity of the packaged air conditioner 22 is insufficient.

<Second Process Flow>

The second process flow of the server cooling system 2 will now be described with reference to the drawings. It is assumed that the server is already in operation and the air conditioner 22 and the thermosiphon 24 are also started up already.

Figure 19:
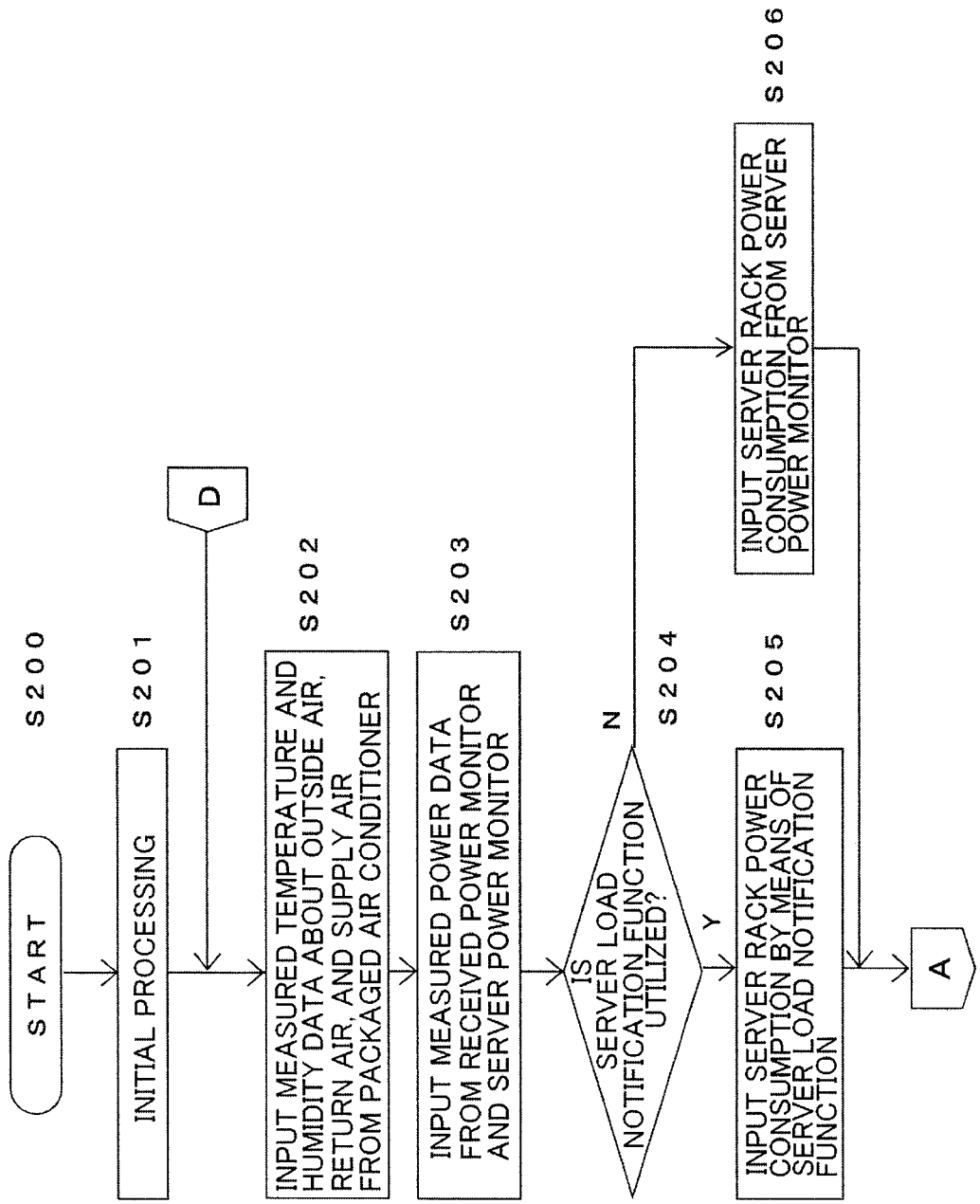
FIG. 19 is a chart showing a process flow of the server cooling system 2.

With reference to FIG. 19, when the control device 30 is powered on, an execution program is started (S200). Next, initial processing is performed (S201). The initial processing includes the following processes.

The constants and the correction coefficient for the characteristic formula, and the outside air temperatures corresponding to the server rack power consumption ranges and the points when the cooling capacity request levels are changed are loaded into the memory from the thermosiphon operation characteristic formula database shown in FIG. 13A and from the packaged air conditioner cooling capacity characteristic database shown in FIG. 13B, respectively (S201).

Next, data measured from the outside air temperature and humidity sensors, the return air temperature and humidity sensors, and the supply air temperature and humidity sensors is obtained (S202). Also, measured data is obtained from the server rack power monitor (S203).

In a case where power consumption data is inputted by means of the server load notification function (Y-branch in S204), a load factor obtained by means of the server load notification function via the network is converted to obtain the power consumption in the server rack 20 (WH_RAC) (S205). In a case where power consumption data is not inputted by means of the server load notification function (N-branch in S204), the data measured by the server rack power monitor is obtained (S206).

Figure 20:
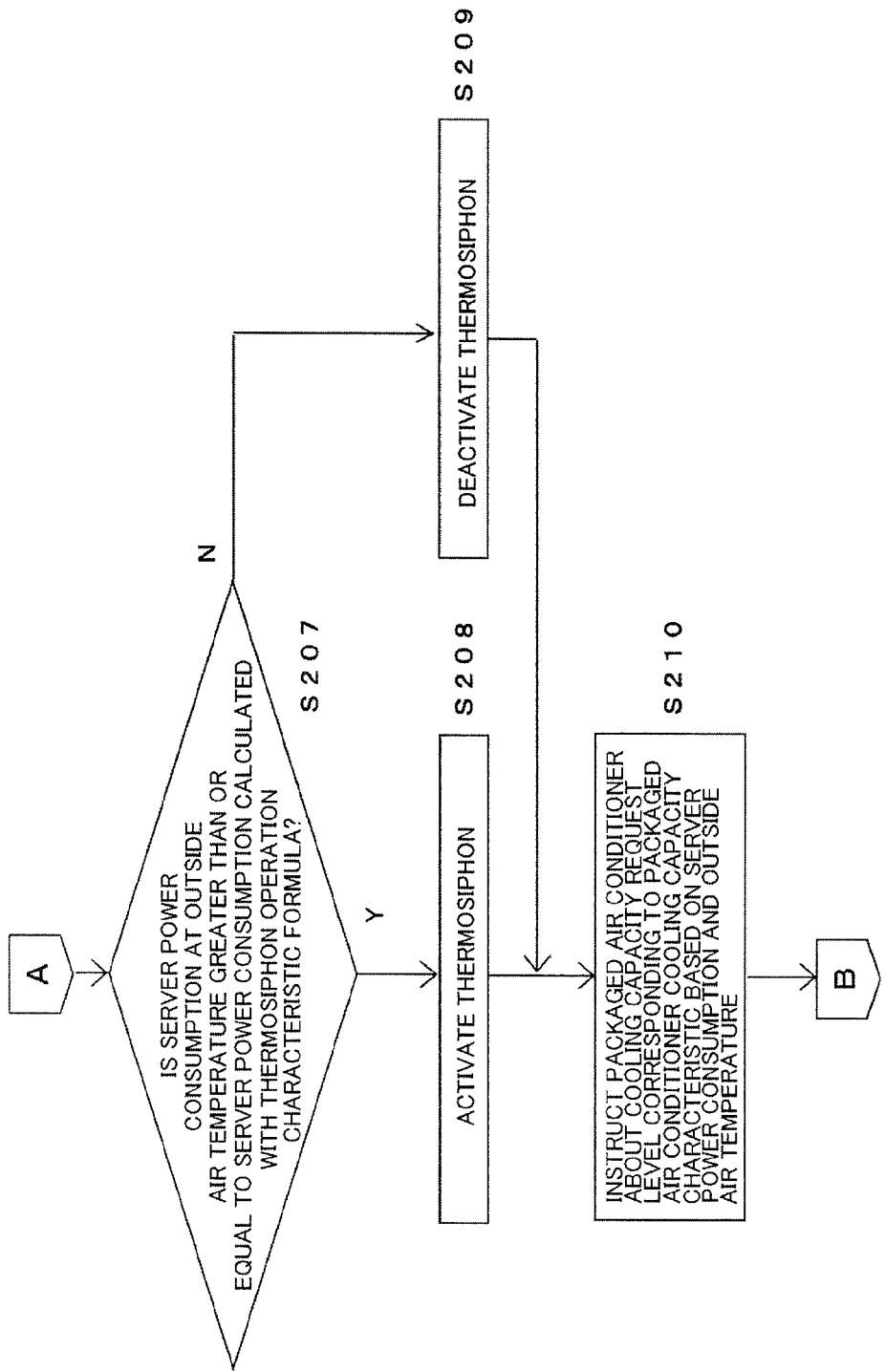
FIG. 20 is a chart showing the process flow of the server cooling system 2.

Referring now to FIG. 20, in a case where the power consumption in the server rack 20 (WH_RAC) for the outside air temperature is greater than or equal to a numerical value calculated with the thermosiphon operation characteristic formula using an outside air temperature as a variable (Y-branch in S207), the thermosiphon 24 is activated (S208). In a case where it is smaller than the numerical value calculated with the thermosiphon operation characteristic formula using an outside air temperature as a variable (N-branch in S207), on the other hand, the thermosiphon 24 is deactivated (S209).

Figure 21:
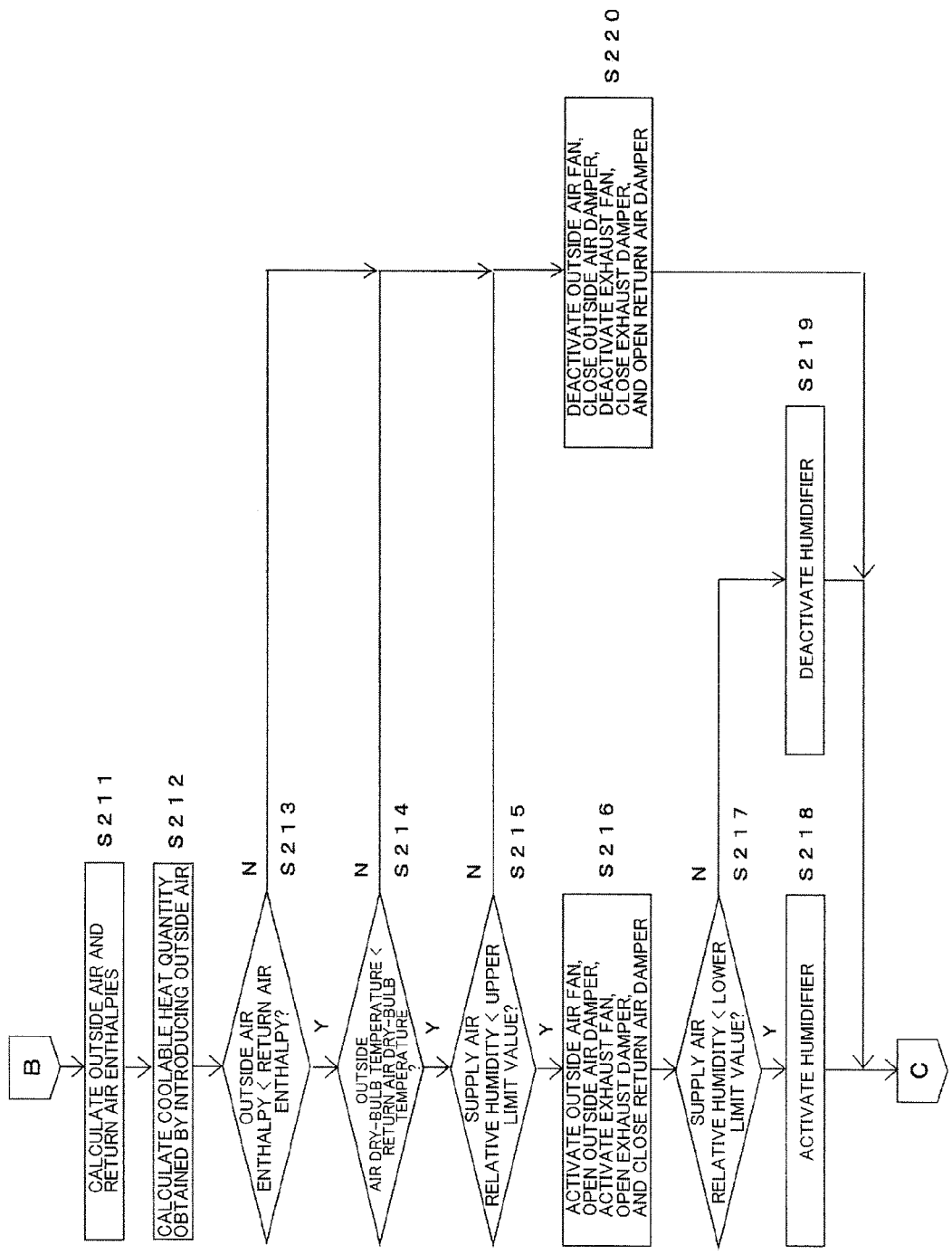
FIG. 21 is a chart showing the process flow of the server cooling system 2.
Figure 22:
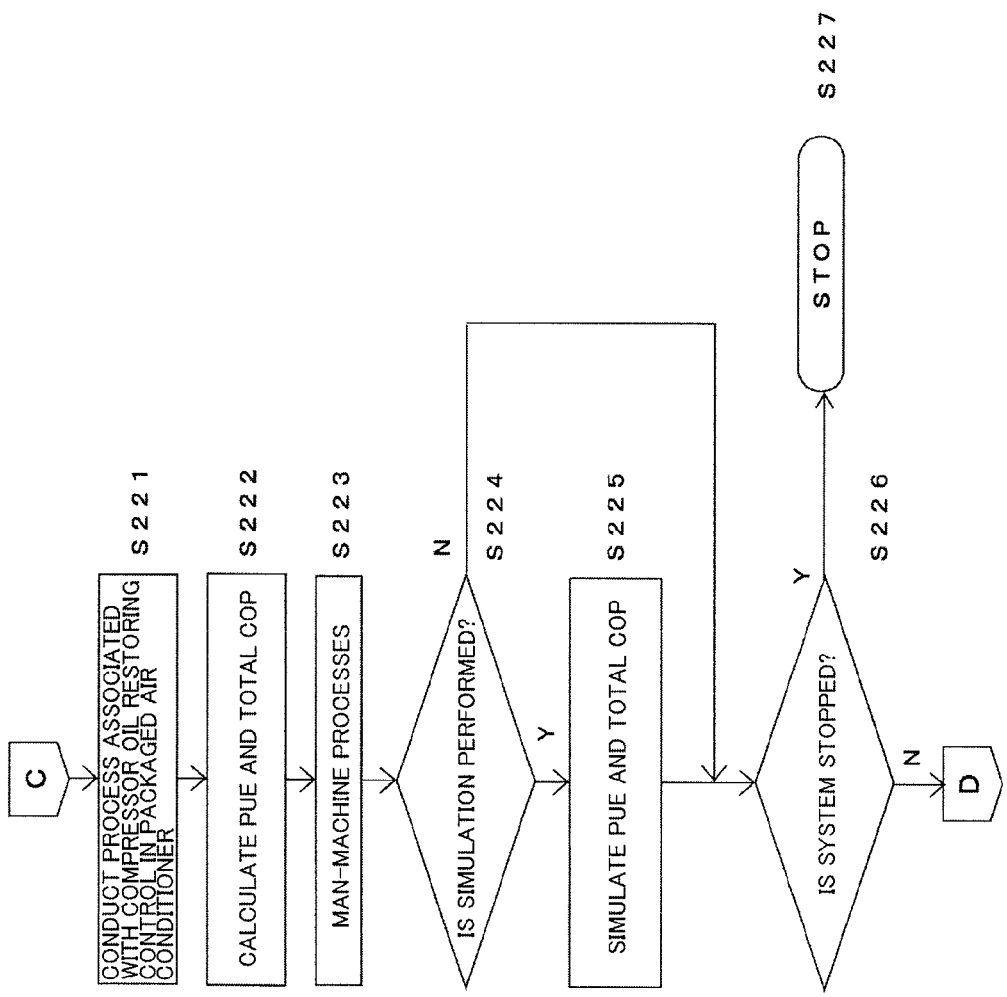
FIG. 22 is a chart showing the process flow of the server cooling system 2.

The subsequent process flow will be the same as that in the first embodiment. Specifically, with the use of the same method as that in the first embodiment, the cooling capacity request level is instructed to the packaged air conditioner 22 (S210). The control for outside air cooling is performed (S211 to S220) (see FIG. 21). The process for the oil restoring control in the compressor of the packaged air conditioner 22 is performed (S221) (see FIG. 22).

The PUE and the total COP are calculated (S222). Man-machine processes are performed. Note however that the display of calculations cannot be performed (S223). In a case where simulation is performed (Y-branch in S224), simulations for the PUE and the total COP are performed with the use of the same method as that in the first embodiment (S225). A stop determination is made (S226 and S227). If it is determined to continue, the flow is returned to immediately before the step S202.

According to the server cooling system 2, the coefficient of performance is obtained simply by an approximate calculation without performing a convergence calculation as described above. Thus, the server cooling system 2 makes it possible to simplify the device configuration and reduce the load on the control device 30.

(Third Embodiment)

Figure 23:
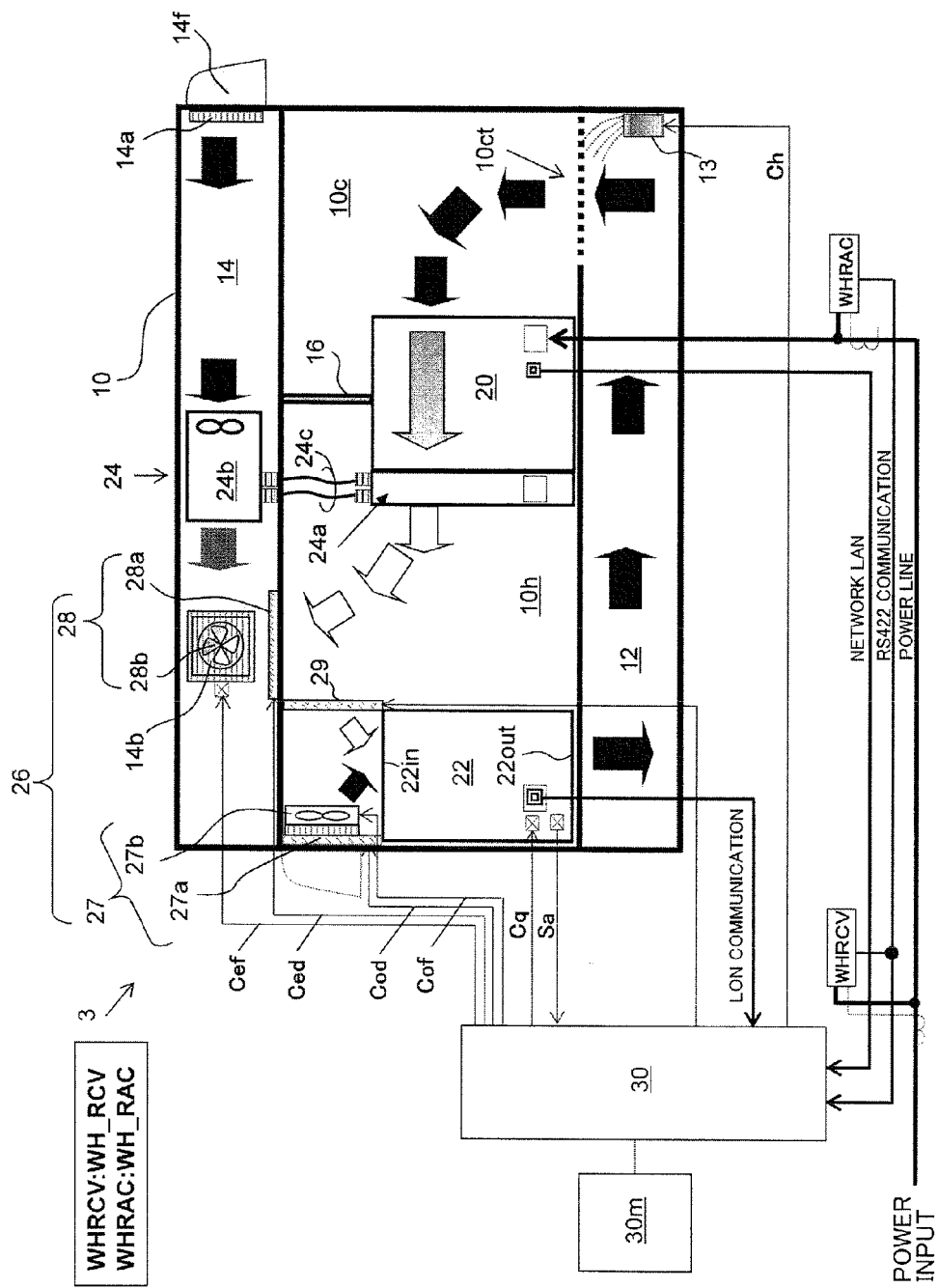
FIG. 23 is a diagram illustrating the configuration of a server cooling system 3.

FIG. 23 shows the configuration of a server cooling system 3 according to the present embodiment. In the server cooling system 3, the control device 30 and the packaged air conditioner 22 are connected with each other via LON (Local Operating Network) communication. The packaged air conditioner 22 has sensors for measuring supply air temperature and humidity (TdbSA and RHSA), return air temperature and humidity (TdbRE and RHRE), and outside air temperature and humidity (TdbOA and RHOA). The control device 30 obtains these values from the packaged air conditioner 22 via the LON communication.

The subsequent processes are the same as those in the second embodiment. Specifically, the power consumption in the server rack 20 (WH_RAC) is obtained with Expression (36) and whether to stop the operation of the thermosiphon 24 is determined on the basis of the magnitude of the WH_RAC relative to the coolable heat quantity Q_L obtained with Expression (31).

<Third Process Flow>

The third process flow of the server cooling system 3 will now be described with reference to the drawings. It is assumed that the server is already in operation and the air conditioner 22 and the thermosiphon 24 are also started up already.

Figure 24:
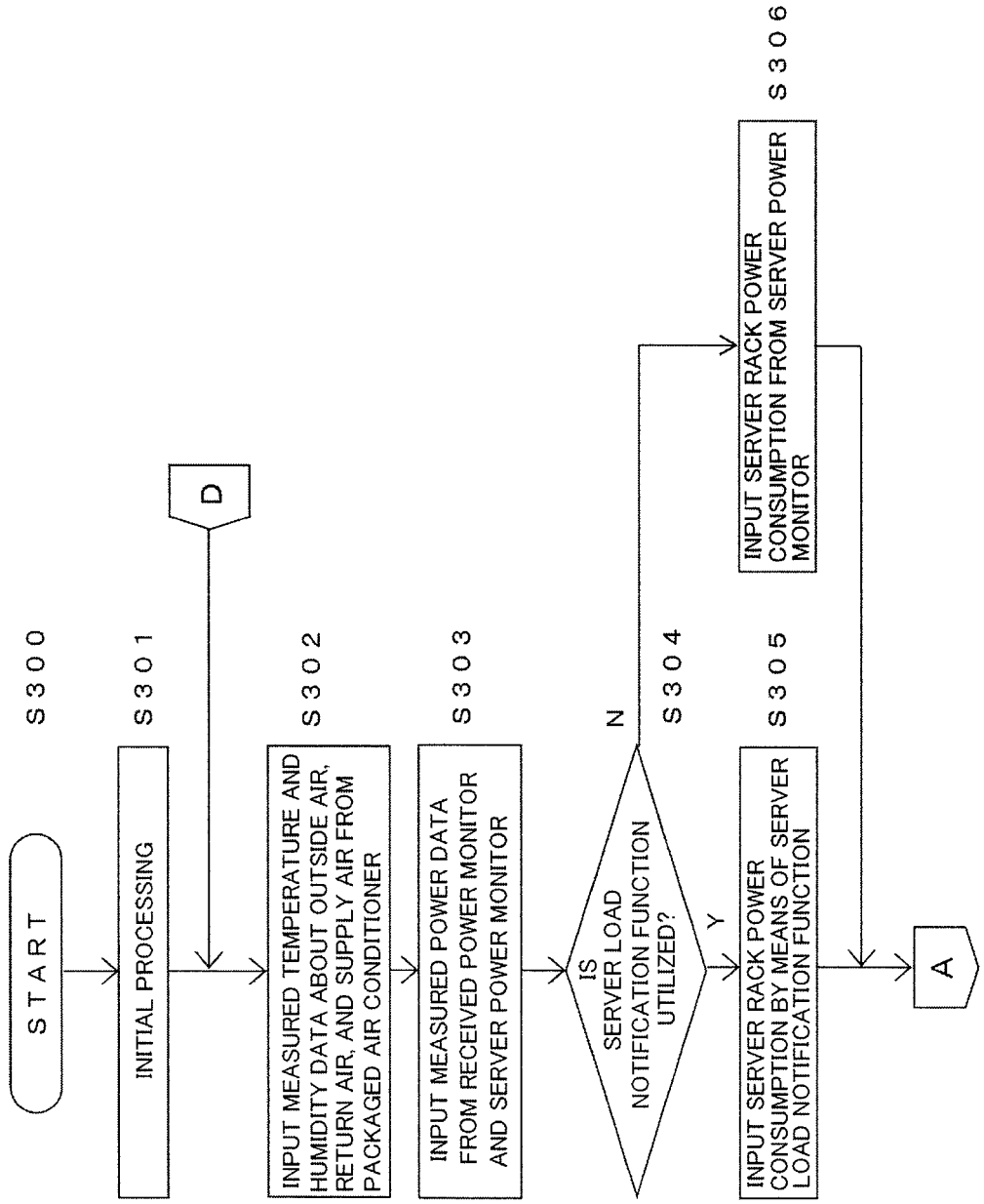
FIG. 24 is a chart showing a process flow of the server cooling system 3.

With reference to FIG. 24, when the control device 30 is powered on, an execution program is started (S300). Next, initial processing is performed (S301). The initial processing includes the following processes.

The constants and the correction coefficient for the characteristic formula and the outside air temperatures corresponding to the server rack power consumption ranges and the points when the cooling capacity request levels are changed are loaded into the memory from the thermosiphon operation characteristic formula database shown in FIG. 13A and from the packaged air conditioner cooling capacity characteristic database shown in FIG. 13B, respectively (S301).

Next, data on the outside air temperature and humidity, the return air temperature and humidity, and the supply air temperature and humidity measured by the packaged air conditioner 22 is loaded into the control device 30 (S302). This is done by the LON communication. Data measured by the server power monitor WHRAC is also loaded (S303).

In a case where power consumption data about the server rack 20 is inputted by means of the server load notification function (Y-branch in S304), a load factor inputted by means of the server load notification function via the network is converted to obtain the power consumption in the server rack 20 (WH_RAC) (S305). In a case where the server load notification function cannot be used (N-branch in S304), the data measured by the server power monitor WHRAC is obtained (S306).

Figure 25:
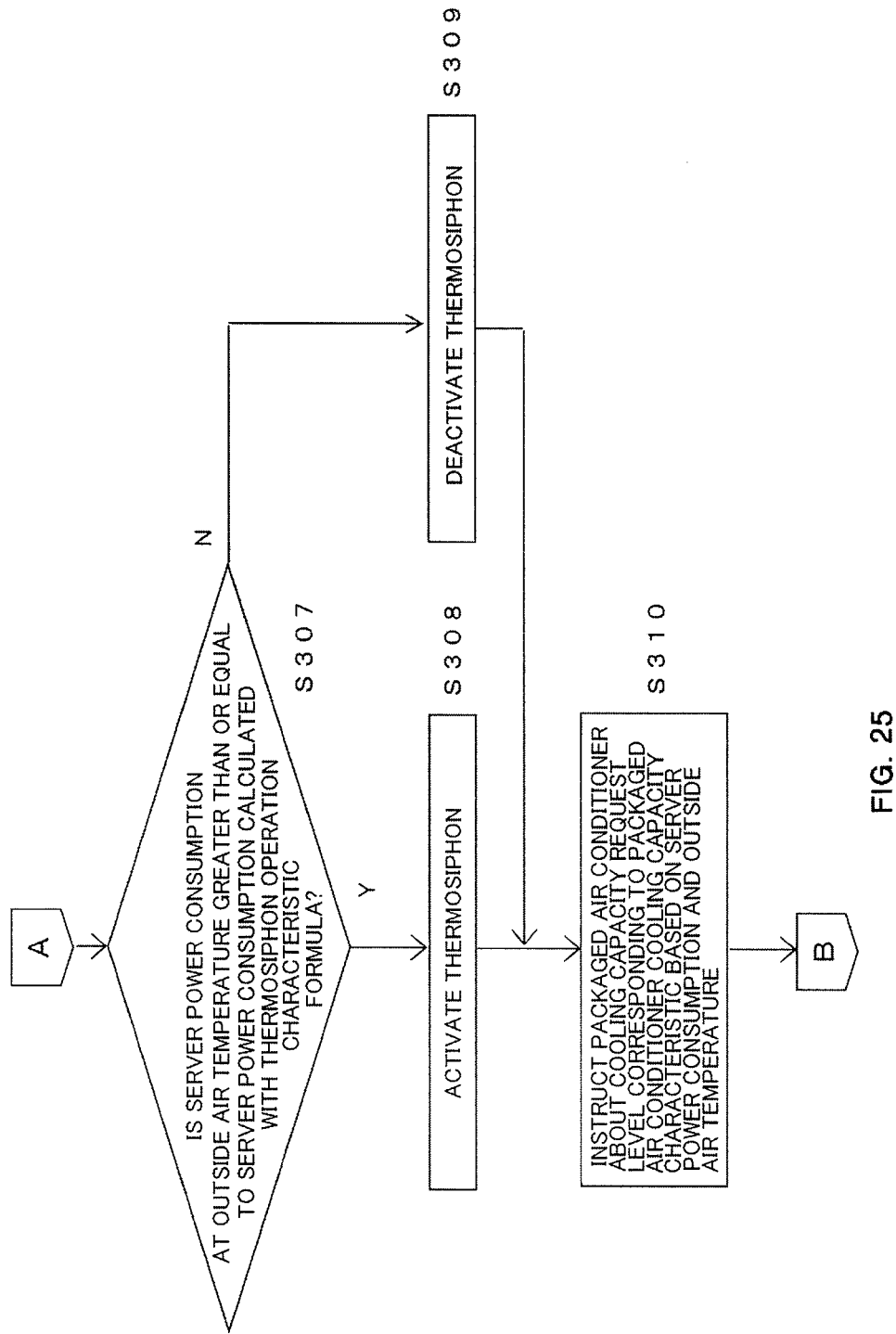
FIG. 25 is a chart showing the process flow of the server cooling system 3.

Referring now to FIG. 25, with the use of the same method employed for the second embodiment, the power consumption in the server rack 20 (WH_RAC) is compared to the numerical value obtained by the calculation of the thermosiphon operation characteristic formula (Expression (36)) using the outside air dry-bulb temperature TdbOA as a variable in order to determine whether to operate the thermosiphon 24 (S307 to S309). Then, with the use of the same method as that in the first embodiment, the cooling capacity request level is instructed to the packaged air conditioner 22 (S310).

Figure 26:
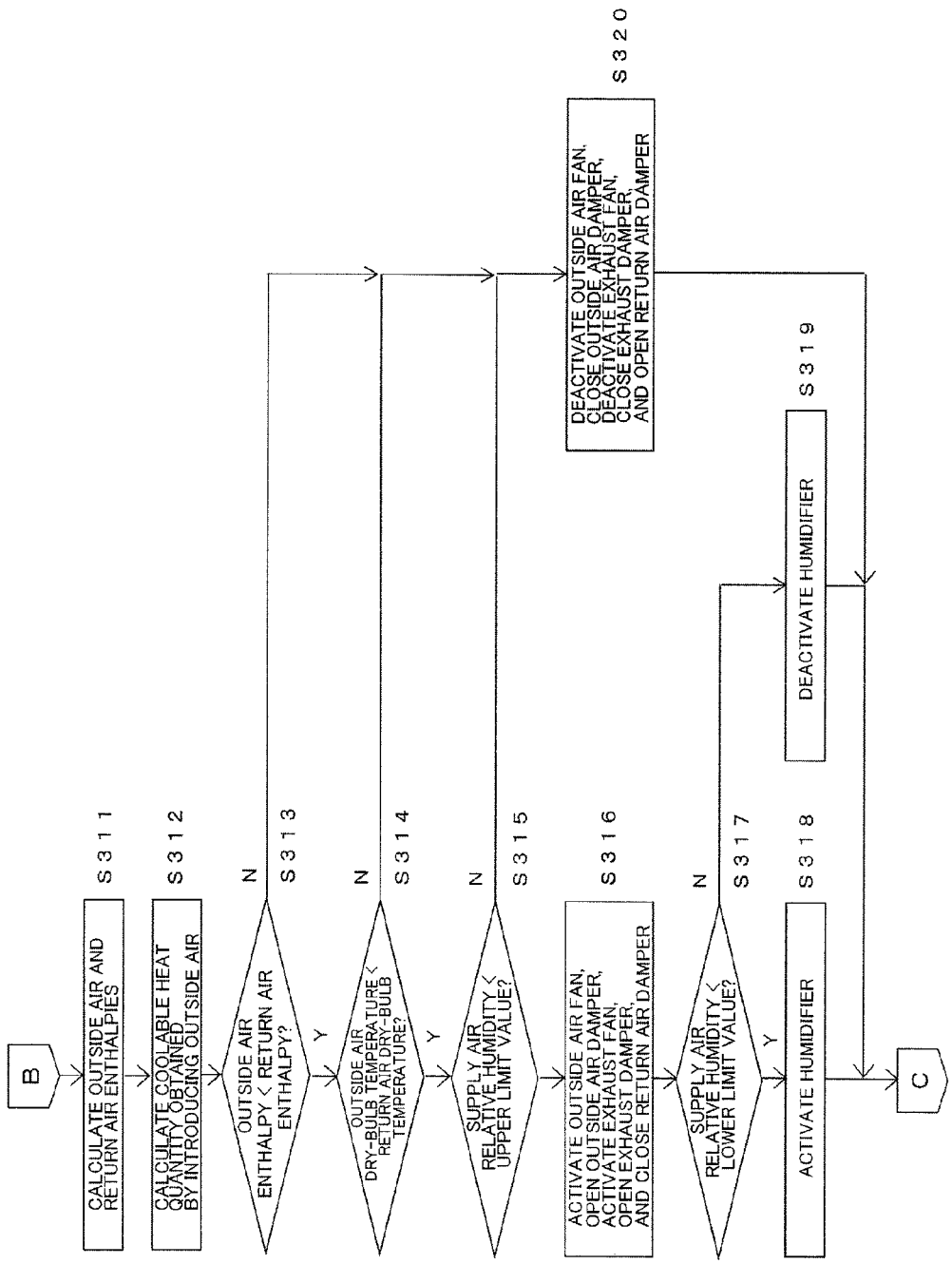
FIG. 26 is a chart showing the process flow of the server cooling system 3.
Figure 27:
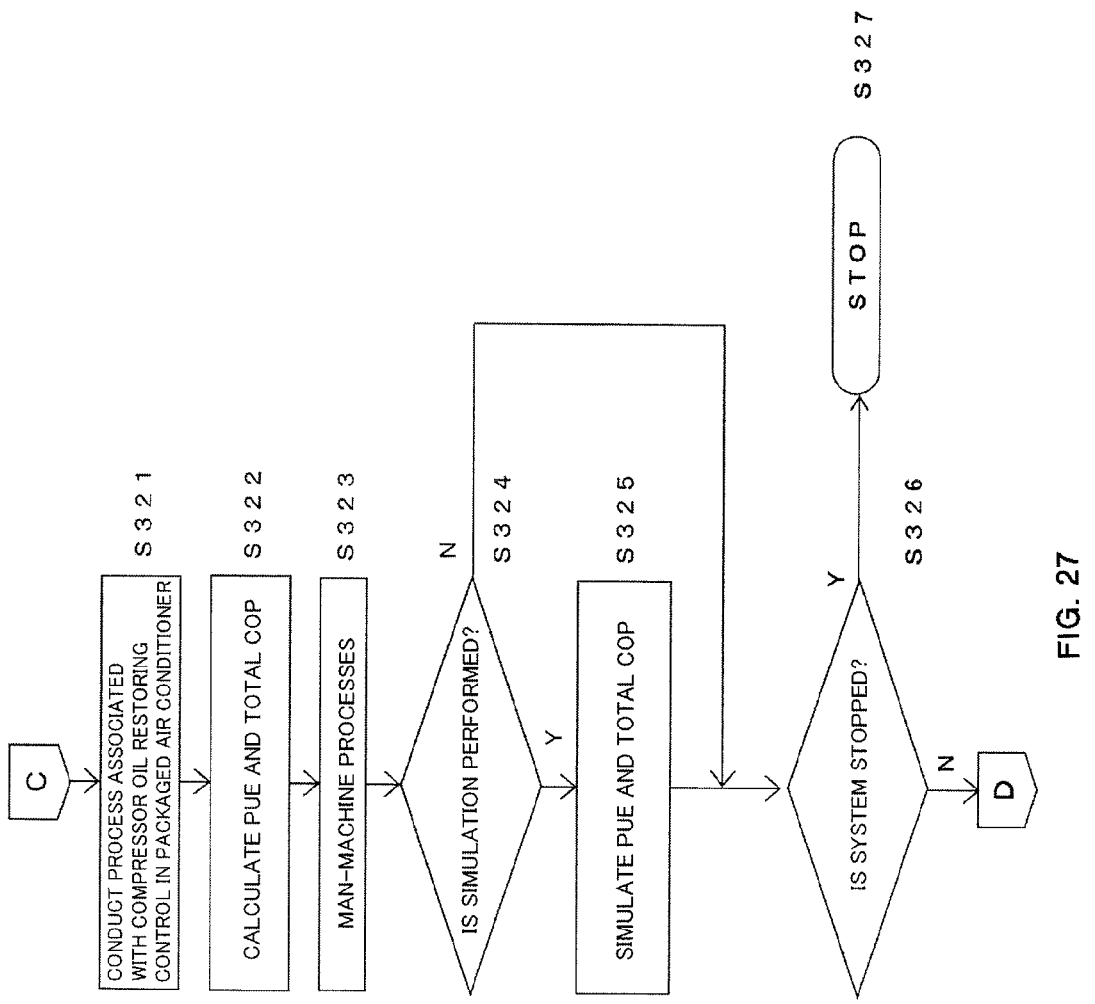
FIG. 27 is a chart showing the process flow of the server cooling system 3.

Referring now to FIG. 26, the control for outside air cooling is performed with the use of the same method as that in the first embodiment (S311 to S320). Referring now to FIG. 27, with the use of the same method as that in the first embodiment, the process for the oil restoring control in the compressor of the packaged air conditioner 22 is performed (S321). Then, the PUE and the total COP are calculated with the use of the same method as that in the first embodiment (S322). Thereafter, man-machine processes are performed with the use of the same method as that in the first embodiment. Note however that the display of calculations cannot be performed (S323).

In a case where simulation is performed (Y-branch in S324), simulations for the PUE and the total COP are performed with the use of the same method as that in the first embodiment (S325). Finally, a stop determination is made (S326 and S327). If it is determined to continue, the flow is returned to immediately before the step S302. As described above, if the packaged air conditioner 22 itself has the temperature and humidity sensors, a simpler configuration can be realized.

INDUSTRIAL APPLICABILITY

The present invention can be suitably used for server cooling systems. It can be utilized advantageously particularly in a cooling system where a thermosiphon and an air conditioner are used in series.

REFERENCE SIGNS LIST 1, 2, 3 Server cooling system
10 Chamber
10c Cold aisle
10h Hot aisle
10ct Cold air supply port
12 Circulation path
13 Humidifier
14 Outside air pathway
14a Inlet
14b Outlet
14f Ventilation fan
16 Partition wall (shielding means)
18 Gallery
18a Slat
18b Opening (of the gallery)
20 Server rack
20u Server unit
20c Central part
20p Peripheral part
21h Portion of supply air having high temperature
21b Portion of supply air being the same as cold air in temperature
22 Air conditioner (packaged air conditioner)
22in Return air inlet
22out Cold air outlet
24 Thermosiphon
24a Evaporator
24b Condenser
26 Outside air cooling means
27 Outside air introducing means
27a Outside air damper
27b Outside air fan
28 Exhaust means
28a Exhaust damper
28b Exhaust fan
29 Return air damper
30 Control device
TSA Supply air temperature sensor
HSA Supply air humidity sensor
TRE Return air temperature sensor
HRE Return air humidity sensor
TOA Outside air temperature sensor
HOA Outside air humidity sensor
TTS1 Thermosiphon evaporator inlet temperature sensor
TTS2 Thermosiphon evaporator outlet temperature sensor
WHPAC Packaged air conditioner power monitor
WHTS Thermosiphon power monitor
WHRAC Server power monitor
WHRCV Received power monitor
TdbSA Supply air dry-bulb temperature
RHSA Supply air relative humidity
TdbRE Return air dry-bulb temperature
RHRE Return air relative humidity
TdbOA Outside air dry-bulb temperature
RHOA Outside air relative humidity
TdEV1 Evaporator inlet temperature
TdEV2 Evaporator outlet temperature
WH_PAC Packaged air conditioner power consumption
WH_TS Thermosiphon power consumption
WH_RAC Server rack power consumption
WH_RCV Received power
EOA Outside air enthalpy
ERE Return air enthalpy
Q_PAC Coolable heat quantity (of packaged air conditioner)
Q_PAC2 Heat quantity to be cooled (by packaged air conditioner)

What is claimed is:

1. A server cooling system comprising:
a chamber substantially divided into two parts with a cold aisle formed in one of the two parts and a hot aisle formed in the other one of the two parts;
a server rack disposed on a boundary between the cold aisle and the hot aisle;
a packaged air conditioner provided on the hot aisle side;
a circulation path disposed so as to extend from the air conditioner to the cold aisle; and
shielding means provided on the boundary excluding the server rack, wherein
the shielding means is provided with a gallery capable of venting from the cold aisle to the hot aisle.

2. The server cooling system according to claim 1, wherein
a thermosiphon including an evaporator and a condenser is disposed on the hot aisle side,
the evaporator is disposed on a hot aisle side of the server rack, and
the condenser is disposed outside the chamber.

3. The server cooling system according to claim 1, further comprising outside air cooling means provided on the hot aisle side, the outside air cooling means including exhaust means for discharging air in the hot aisle, and outside air introducing means for introducing and supplying outside air to the circulation path.

4. The server cooling system according to claim 1, wherein an operating state of the air conditioner is changed on the basis of a server rack power consumption.

5. The server cooling system according to claim 1, wherein a coefficient of performance of the thermosiphon is calculated and whether to operate the thermosiphon is determined on the basis of a comparison between the coefficient of performance and a coefficient of performance of the air conditioner.

6. The server cooling system according to claim 1, wherein whether to operate the thennosiphon is determined on the basis of an outside air temperature.

7. The server cooling system according to claim 1, wherein the outside air cooling means is employed when:
an outside air enthalpy is smaller than an enthalpy of air in the hot aisle;
an outside air dry-bulb temperature is lower than a dry-bulb temperature in the hot aisle; and
a relative humidity of cold air supplied into the cold aisle is lower than a predetermined upper limit value.

8. The server cooling system according to claim 7, further comprising a humidifier for humidifying the cold air supplied into the cold aisle, and wherein if the relative humidity of the cold air is lower than a predeteimined relative humidity, the humidifier is activated.

9. The server cooling system according to claim 1, wherein when the packaged air conditioner performs compressor oil restoring control, the thermosiphon and the outside air cooling means are deactivated.

* * * * *